United States Patent
Sato

(10) Patent No.: US 9,564,608 B2
(45) Date of Patent: Feb. 7, 2017

(54) DISPLAY DEVICE

(71) Applicant: Japan Display Inc., Tokyo (JP)

(72) Inventor: Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/736,889

(22) Filed: Jun. 11, 2015

(65) Prior Publication Data

US 2015/0364523 A1 Dec. 17, 2015

(30) Foreign Application Priority Data

Jun. 12, 2014 (JP) ................................ 2014-121304

(51) Int. Cl.
*H01L 51/52* (2006.01)
*H01L 51/50* (2006.01)
*H01L 27/32* (2006.01)

(52) U.S. Cl.
CPC ......... *H01L 51/5203* (2013.01); *H01L 51/502* (2013.01); *H01L 51/5218* (2013.01); *H01L 51/5225* (2013.01); *H01L 51/5271* (2013.01); *H01L 27/322* (2013.01); *H01L 27/3211* (2013.01); *H01L 27/3244* (2013.01)

(58) Field of Classification Search
CPC ...... H01L 27/156; H01L 33/06; H01L 33/405; H01L 33/38; H01L 33/62; H01L 21/77; H01L 27/15; H01L 33/40
See application file for complete search history.

(56) References Cited

U.S. PATENT DOCUMENTS

| 7,709,824 B2 * | 5/2010 | Choi .................. H01L 51/5036 257/13 |
| 8,809,893 B2 * | 8/2014 | Choi ...................... H01L 33/08 136/252 |
| 2005/0046342 A1 | 3/2005 | Park et al. |
| 2005/0116620 A1 | 6/2005 | Kobayashi |
| 2008/0164460 A1 * | 7/2008 | Oyamada ............ H01L 27/3244 257/40 |
| 2008/0217602 A1 | 9/2008 | Kahen |

(Continued)

FOREIGN PATENT DOCUMENTS

| CN | 1607879 A | 4/2005 |
| CN | 1615060 A | 5/2005 |

(Continued)

OTHER PUBLICATIONS

Korean Notice of Rejection issued on Oct. 26, 2016 for corresponding Korean Application 10-2015-0079375 with partial translation.

(Continued)

*Primary Examiner* — Scott B Geyer
(74) *Attorney, Agent, or Firm* — Typha IP LLC

(57) ABSTRACT

A display device includes a pixel part provided with a plurality of pixels, and a light emitting device provided in the pixel, wherein the light emitting device includes a light emitting layer including a quantum dot, a first electrode provided on one surface of the light emitting layer, an insulation layer provided between the light emitting layer and the first electrode, and a second electrode provided between the light emitting layer and the insulation layer, and at least one end part of the second electrode layer is provided over the first electrode.

10 Claims, 48 Drawing Sheets

(56) References Cited

U.S. PATENT DOCUMENTS

| | | | |
|---|---|---|---|
| 2009/0008628 A1 | 1/2009 | Choi et al. | |
| 2010/0051901 A1* | 3/2010 | Kazlas | B82Y 20/00 |
| | | | 257/13 |
| 2011/0220869 A1 | 9/2011 | Cho et al. | |
| 2011/0241031 A1* | 10/2011 | von Malm | H01L 27/156 |
| | | | 257/88 |

FOREIGN PATENT DOCUMENTS

| | | |
|---|---|---|
| CN | 102265399 A | 11/2011 |
| JP | 2010-520603 A | 6/2010 |
| JP | 2012-146689 A | 8/2012 |
| KR | 10-2011-0099753 A | 9/2011 |
| KR | 10-2011-0109572 A | 10/2011 |

OTHER PUBLICATIONS

Examiner's Notice of Reason for Rejection issued by SIPO on Nov. 10, 2016 for Counter Chinese Application No. 201510303558.1. With partial English Translation.

\* cited by examiner

DISPLAY DEVICE

CROSS REFERENCE TO RELATED APPLICATIONS

This application is based upon and claims the benefit of priority from the prior Japanese Patent Application No. 2014-121304, filed on Jun. 12, 2014, the entire contents of which are incorporated herein by reference.

FIELD

The present invention is related to a display device using a light emitting device. One embodiment of the invention disclosed in the present specification includes a display device configured with a pixel using a light emitting device which uses a quantum dot.

BACKGROUND

Applications for display devices using nano-scale light emitting materials known as semiconductor nano-particles or quantum dots are attracting attention. A quantum dot is a material having a particle diameter of a few nanometers and is comprised from a group of compound such as II-VI group compound, III-V group compound, and IV-VI group compound. These nanoparticles emit light when irradiated with an external energy beam (ultraviolet light or blue light etc.) or by applying and electrical field. Conventionally, although an electroluminescence material is known as a light emitting material, a quantum dot can adjust a light emitting wavelength by changing the size of a particle, and includes the advantages of high light emitting efficiency and no concentration quenching which could not be obtained in conventional materials.

As a result, a display device using a quantum dot as a new light emitting device instead of an organic electroluminescence material has been proposed. For example, a light emitting device including a polycrystalline inorganic light emitting layer including a translucent first electrode, a second electrode facing the first electrode and a quantum dot within an inorganic semiconductor matrix above a transparent substrate is disclosed in Japanese Laid Open Patent 2010-520603. In addition, a manufacturing method of a quantum dot organic electric field light emitting device including forming a first electrode layer above a substrate, forming a quantum dot template film including a plurality of nano size through holes from a block copolymer film which can be phase separated above the first electrode layer, and forming a quantum dot including an organic light emitting layer within a through hole of a quantum dot template film is disclosed in Japanese Laid Open Patent 2012-146689.

SUMMARY

According to one embodiment of the present invention, a display device is comprising a pixel part provided with a plurality of pixels, a light emitting device provided in the pixel, the light emitting device includes a light emitting layer including a quantum dot, a first electrode provided on one surface of the light emitting layer, an insulation layer provided between the light emitting layer and the first electrode, a second electrode provided between the light emitting layer and the insulation layer; and at least one end part of the second electrode layer is provided over the first electrode.

According to one embodiment of the present invention, a display device comprising a pixel part provided with a pixel, a light emitting device provided in the pixel, the light emitting device includes a light emitting layer including a quantum dot, a first electrode provided on one surface of the light emitting layer, an insulation layer provided between the light emitting layer and the first electrode, and a second electrode provided between the light emitting layer and the insulation layer, the first electrode includes a first bus electrode and a first grid electrode extending from the first bus electrode, the second electrode is includes a first bus electrode and a second grid electrode extending from the first bus electrode; and the first grid electrode and the second grid electrode are provided meshed together via the insulation layer.

DESCRIPTION OF EMBODIMENTS

Figure 1:
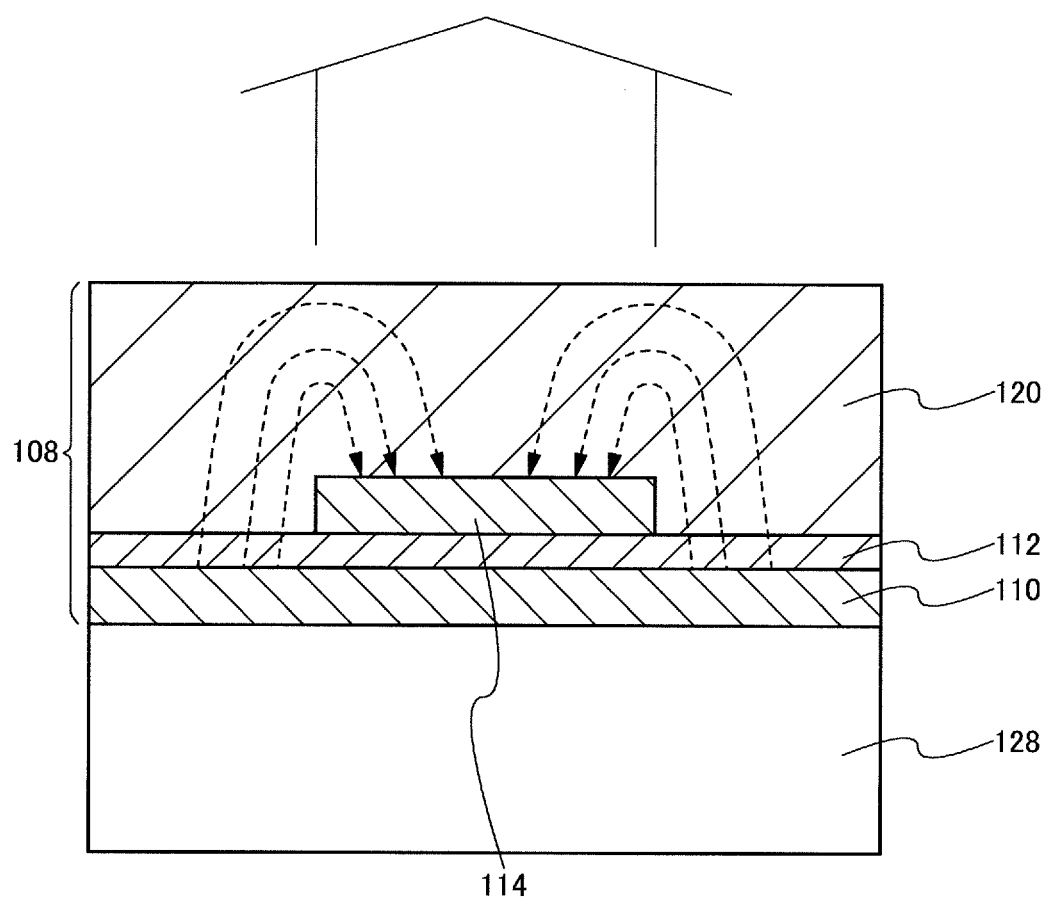
FIG. 1 is a cross-sectional diagram showing a structure of a light emitting device related to one embodiment of the present invention.
Figure 2:
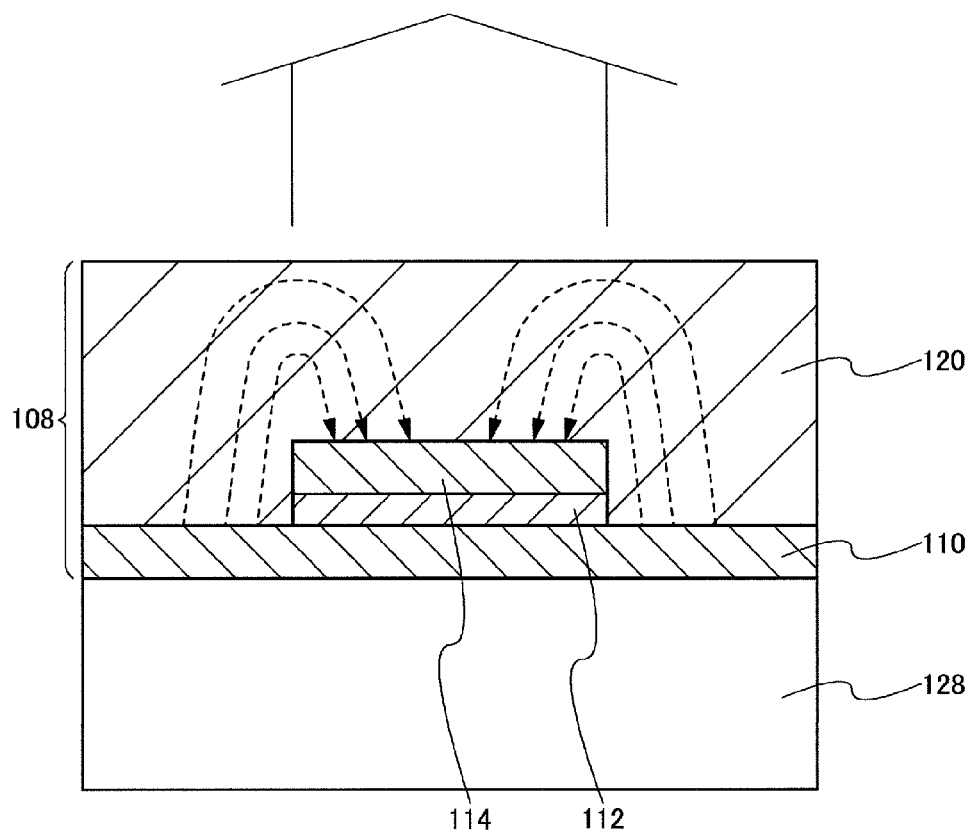
FIG. 2 is a cross-sectional diagram showing a structure of a light emitting device related to one embodiment of the present invention.

Each embodiment of the present invention is explained below while referring to the drawings. Furthermore, the disclosure is merely one example and various modifications which conform to the premise of the invention and which could be easily conceived of by person ordinarily skilled in the art are included within the scope of the present invention. In addition, in order to further clarify explanation, the drawings may be expressed schematically with respect to the width, thickness and shape of each part compared to actual appearance and are only examples and do not limit the interpretation of the present invention. In addition, in the specification and each drawing the same reference symbols are attached to the same devices that have previously been described or already exist in previous drawings and therefore a detailed explanation is sometimes omitted where appropriate.

In the present specification, in the case where certain components or areas are present "over" or "under" and "above" or "below" other components or areas, as long as there are no particular limitations, this includes not only the case where components or areas are directly above or directly below other components or areas but also the case where components or areas are above or below other components or areas with other structural components provided in between.

Although the polycrystalline inorganic light emitting layer disclosed in Japanese Laid Open Patent 2010-520603 is formed by a quantum dot and annealing a colloidal dispersion solution of a semiconductor matrix nanoparticle, it is difficult to accurately control film thickness in this type of manufacturing method. While a light emitting device using a quantum dot emits light by applying an electrical field between a pair of electrodes, regardless of the manufacturing method, in a structure in which a light emitting layer including a quantum dot is inserted between a pair of electrodes the light emitting intensity changes due to variation in the film thickness of this light emitting layer. When this in within a surface of a pixel part of a display device, the light emitting intensity varies between pixels due to lack of uniformity of film thickness of a light emitting layer including a quantum dot which is problem. Furthermore, when a light emitting device having a structure in which a first electrode, a light emitting layer including a quantum dot and a second electrode are stacked vertically is applied to a high definition panel including a micro-pixel without adjustment, light leaking occurs between adjacent pixels and accurate color display cannot be achieved.

On the other hand, the organic electric field light emitting layer including a quantum dot structure disclosed in Japanese Laid Open Patent 2012-146689 gathers the light emitting layers themselves into a fine pillar shape. However, the manufacturing method of a light emitting layer is complex and difficult.

As is disclosed in Japanese Laid Open Patent 2010-520603 and Japanese Laid Open Patent 2012-146689, in a structure in which a quantum dot is inserted between a first electrode and a second electrode, even if light emitting efficiency with a light emitting layer is high, the light emitted due to adsorption or reflection loss at a boundary is attenuated due light passing through a first electrode.

One embodiment of the present invention shown below aims to suppress variation in light emitting intensity caused when using a quantum dot and improves uniformity within a surface of a pixel region. In addition, the present invention aims to prevent light from leaking to an adjacent pixel even in the case where a pixel has high resolution.

First Embodiment

FIG. 1 shows a cross-sectional diagram of a structure of a light emitting device 108 related to one embodiment of the present invention. The light emitting device 108 includes a first electrode 110, a second electrode 114, an insulation layer 112 and a light emitting layer 120. The first electrode 110 and the second electrode 114 are provided on one surface of the light emitting layer 120 above the substrate 128. The first electrode 110 and second electrode 114 are provided sandwiching the insulation layer 112. The light emitting layer 120 is provided above the insulation layer 112 and the second electrode 114 is provided to be covered by the light emitting layer 120.

The first electrode 110 and second electrode 114 are stacked sandwiching the insulation layer 112. The second electrode 114 has a strip shape or a matrix shape and is provided comparatively narrow with respect to the first electrode 110 which is provided widely. Therefore, the area of a part of the second electrode 114 which overlaps the first electrode 110 is relatively small with respect to the area of the first electrode 110. In other words, the end part of the second electrode 114 is provided to be placed above the first electrode 110. That is, the second electrode is provided so that at least one part of the end part overlaps on the inner side which does not reach the end part of the first electrode 110. Furthermore, the structure of the light emitting device adopted in the present invention is not limited to that shown in FIG. 1, for example, various modified structures such as an electrode structure, insulation layer or light emitting layer may be adopted.

The light emitting layer 120 including a quantum dot is provided via the insulation layer 112 on an upper part of the first electrode 110. Various forms can be applied to the light emitting layer 120 including a quantum dot. For example, the light emitting layer 120 may be formed by an aggregate of quantum dots may by dispersed in a mother material which is an inorganic or organic semiconductor. Alternatively, the light emitting layer 120 includes a form in which a plurality of layers such as a hole or electron injection layer, hole or electron transport layer and a layer including a quantum dot may be provided so as to overlap on an upper part of these layers. In addition, a carrier injection layer and a carrier transport layer which operate in common with respect to holes or electrons are uniformly formed and a layer including a quantum dot is provided so as to overlap on an upper part there upon.

In the structure shown in FIG. 1, an electric field is generated when a potential difference is applied between the first electrode 110 and second electrode 114. FIG. 1 schematically shows using a dotted line an electric field distribution generated between the first electrode 110 and second electrode 114. An electric field is generated towards the first electrode 114 from the first electrode 110. Alternatively, an electric field is generated towards the first electrode 110 from the second electrode 114. That is, as is shown in FIG. 1, by arranging the second electrode 114 so that an end part is positioned on an inner side of the first electrode 110, it is possible to generated a fringe electric field towards the second electrode 114 from the first electrode 110 (or in the reverse direction). Furthermore, the direction of the electric power line shown in FIG. 1 is an example and the electric field distribution changes depending on the size of the potential between the first electrode 110 and second electrode 114 and size of the potential difference.

Since the insulation layer 112 and the light emitting layer 120 exists between the first electrode 110 and the second electrode 114, a fringe electric field is distributed across these. When a fringe electric field is applied at certain intensity between the first electrode 110 and second electrode 114, the light emitting layer 120 emits light. The fringe electric field emits Fowler-Nordheim tunneling electrons to the light emitting layer 120 via the insulation layer 112 from the first electrode 110, and the emitted electrons are injected into the light emitting layer as carriers. As a light emitting mechanism, for example, the injected carriers are accelerated by an electric field, quantum dots included in the light emitting layer 120 are trapped at a delocalized level, and by emitting photons when the carriers shift to a ground state, the light emitting layer 120 emits light. Since the injection amount of carriers to the light emitting layer 120 changes according to the intensity of the electric field, it is possible to control the light emitting intensity of the light emitting device 108 by the intensity of the electric field.

As descried above, the light emitting device 108 related to the present embodiment is provided with the first electrode 110 and second electrode 114 sandwiching the insulation layer 112, and this includes a structure in which an electrode is provided on one surface of the light emitting layer 120 and an electrode is not provided on the other surface. The light emitting layer 108 has a surface on which an electrode is not provided which becomes a light irradiation surface and light emitted by the light emitting layer 120 is irradiated in all directions. The light irradiated towards the light irradiation surface from the light emitting layer 120 can be extracted as irradiated light to the exterior. On the other hand, on the opposite side, light irradiated to the first electrode 110 side from the light emitting layer 120 is reflected by the first electrode 110 and a part of this reflected light ca be extracted as emitted light to the exterior from the light emitting surface of the light emitting layer 120. As a result, it is preferred that the first electrode 110 be formed from a metal material with high reflectance.

In order to make the first electrode 110 an electrode with high reflectance, it is preferred that a metal material such as aluminum (Al), silver (Ag) or an alloy of these be used. Since aluminum (Al) and silver (Ag) and the like have low resistance and high light reflectance, it is possible suitably use them as the first electrode 110.

The light emitting device 108 related to the present embodiment is provided with the insulation layer 112 sandwiched by the first electrode 110 and second electrode 114 for controlling emitted light on one surface of the light emitting layer and the other surface becomes a light emitting surface as is shown in FIG. 1. Since an obstacle such as a metal electrode for absorbing or blocking light is not provided on this light emitting surface, it is possible to increase the extraction efficiency of light generated in the light emitting layer 120.

Furthermore, in the present specification "light extraction efficiency" refers to the ratio of the number of photons which can be extracted to the exterior with respect to the number of photons generated within a light emitting layer.

However, although a conventional sandwich type light emitting device in which the top and bottom of a light emitting layer are sandwiched by electrodes is provided with a translucent electrode in a light emitting surface, because light absorption and reflectance is zero by this translucent electrode, there is a drop in the light extraction efficiency by this amount. In addition, although light emitting intensity of the light emitting device is changed by the electric field intensity between a pair of electrodes, when the film thickness of a light emitting layer becomes varied between devices or within a device, the electric field intensity changes and the emitting intensity changes as a result.

In the present embodiment, the light emitting layer 120 including a quantum dot can be manufactured using various manufacturing methods. For example, it is possible to manufacture the light emitting layer by a wet process such as printing or coating a solution including a quantum dot. In this case, a problem occurs whereby light emitting intensity becomes varied between devices in a conventional structure when the film thickness of a light emitting layer becomes varied. However, since the light emitting device 108 related to the present embodiment includes a structure which does not directly receive the effects of film thickness of the light emitting layer 120, it is possible to suppress variation in light emitting intensity.

That is, because the light emitting device 108 shown in the present embodiment has the merit whereby it is difficult for light intensity to fluctuate due to the film thickness of the light emitting layer 120 since the electric field intensity is determined by the film thickness of the insulation film 112 located between the first electrode 110 and second electrode 114. It is easy to control the film thickness and obtain uniformity of the insulation layer 112 by applying an established thin film formation technique such as a sputtering method or CVD (Chemical Vapor Deposition) method. If the film thickness of the insulation layer 112 is constant, it is possible to make the electric field intensity constant regardless of the variation in film thickness of the light emitting layer 120. Therefore, it is possible to control the light emitting intensity of the light emitting device 108 related to the present embodiment without receiving the effects of the film thickness distribution of the light emitting layer 120.

Furthermore, it is possible to apply an inorganic insulation material or organic insulation material as the insulation layer 112 used in the light emitting device 108. It is possible to use an insulation material comprised of an oxide or nitride such as oxides such as silicon oxide, silicon nitride and aluminum oxide as the inorganic insulation material. It is possible to use an organic material such as polyimide as the organic insulation material.

The light emitting intensity of the light emitting device 108 is determined by the sum value of the electric field intensity of the fringe electric field formed between the first electrode 110 and the second electrode 114. Therefore, the inner surface distribution of the light emitting intensity in the light emitting device 108 can even be controlled by a geometric shape (planar shape) of the second electrode 114.

Although there is no particular limitation to the shape of the second electrode 114, it is preferred that the second electrode 114 be formed in a strip shape or lattice shape in order to generate a fringe electric field which spreads in the light emitting layer 120. Furthermore, the shape of the second electrode 114 is not limited to a strip shape or lattice shape, an arbitrary shape may be formed so that the second electrode 114 includes one or a plurality of apertures. For example, the second electrode may have a mesh shape or a structure similar to a punching plate provided with one or a plurality of through holes in a flat plate.

In either case, in order to effectively operate a fringe electric field generated by the first electrode 110 and second electrode 114 in the light emitting layer 120, it is preferred that the second electrode 114 include a fine pattern thinned into a mesh shape in a region overlapping the first electrode 110. The effective light emitting region is expanded by miniaturizing the form of the second electrode so that an electric field operates densely within the surface of the light emitting layer 120 and it is possible to increase light emitting luminosity.

Since it is sufficient that the second electrode 114 be formed using a conductive thin film above the insulation layer 112, it is possible to form a fine accurate pattern using photolithography. Therefore, the second electrode 114 can be formed with fine geometric shape with high precision. As a result, it is basically difficult for the light intensity of the light emitting device 108 related to the present embodiment to be affected by the light emitting layer 120 including a quantum dot material, the film thickness of the insulation layer 112 provided between the first electrode 110 and the second electrode 114 and the pattern dimensions of the second electrode 114 become predominant and it is possible to control light intensity by the quality of processing. That is, even if the film thickness of the light emitting layer 120 including a quantum dot material is not formed to a high level of precision, it is possible make the light intensity or inner surface distribution constant.

The second electrode 114 can be formed from various metal materials such as aluminum (Al), titanium (Ti), nickel (Ni), molybdenum (Mo), or tungsten (W), or an alloy material of thee such as molybdenum (Mo)-tungsten (W).

Since the first electrode 110 and second electrode 114 are both provided on a surface on an opposite side to the light emitting side of the light emitting layer 120, even if a metal material which does not allow light to pass through is provided, emitted light is never blocked from the light emitting layer 120. That is, since it is possible to ensure that an obstacle that blocks or absorbs light to the side to which light is emitted from the light emitting layer 120 does not exist, it is possible to reduce a loss in light. In addition, if the second electrode 114 is formed using a transparent conductive material such as indium oxide including tin oxide (ITO), the light reflected by the first electrode 110 is allowed to pass through the second electrode 114 and it is possible to emit light from the light emitting layer 120 and increase light extraction efficiency.

An end part side surface of the second electrode 114 formed in a certain shape may stand perpendicular or may be an incline surface (taper shaped surface) inclining and opening upwards. When the end part side surface of the second electrode 114 is an incline surface, because it is possible to closely contact and cover a step of the light emitting layer 120 using the second electrode 114, it is possible to increase light emitting efficiency.

It is possible to suitably use various materials for the quantum dot included in the light emitting layer 120. For example, it is possible to use fine particles of a compound semiconductor or oxide semiconductor having a size of several nm-several tens of nm as the quantum dot. A material comprised from a II-VI group compound semiconductor (CdSe, CdS, CdTe, ZnO, ZnS, ZnTe, HgS, HgTe, CdZnSe etc.), a material comprised from a III-V group compound semiconductor (InAs, InP, InN, GaN, InSb, InAsP, InAsP, InGaAs, GaAs, GaP, AlP, AlN, AlSb, CdSeTe, ZnCdSe) or a material comprised from a IV-Vi group compound semiconductor (PbSe, PbTe, PbS, PbSnTe, $Tl_2SnTe_5$ etc.) are available as these fine particles.

In addition, a material comprised from a semiconductor of group 14 elements may also be used as the quantum dot. For example, it is possible to use graphene provided in a planar shape in which a six-membered ring of carbon atoms of a one atomic layer are linked.

The structure of a quantum dot may include only a core part which is a light emitting member and may be a core/shell structure including a shell part on the periphery of the core part. In addition, the quantum dot may also have a multi-shell structure such as a shell/core/shell structure. Furthermore, a shell is a substance provided for increasing the closing function of an electron or hole into a core part and is preferred to be a substance with larger bandgap energy than the core part. Using this core part it is possible to reduce the loss of electrons or holes in non-light emitting transition and improve light emitting efficiency.

It is possible to form a quantum well by including such a quantum dot in a light emitting layer. This quantum well operates as a light emitting center within the light emitting layer 120. Carriers injected into the light emitting layer 120 are trapped in the quantum well formed by a quantum dot and light is emitted by a recombination process.

The quantum dot can control the emitted light, that is, the light emitted wavelength, by the composition of the material and size of the particles. Therefore, it is possible to make a spectrum peak sharp and obtain emitted light with high color purity by dispersing quantum dots with a uniform particle diameter in the light emitting layer 120.

In the present embodiment, the light emitting layer 120 may have a film thickness which can receive the effects of a fringe electric field and emit light by the second electrode 114. For example, the light emitting layer 120 may have a thickness so that an aperture (for example, an aperture part between a strip shaped pattern arrangement) provided in the second electrode 114 is filled. In addition, the light emitting layer 120 may also have a film thickness to the extent that the second electrode 114 is completely filled.

It is possible to apply a DC voltage as a voltage applied to the first electrode 110 and the second electrode 114. In addition, the light emitting device 108 may be driven by applying an AC voltage. In the present embodiment, since the first electrode 110 and the second electrode 114 are separated by the insulation layer 112, the light emitting device has a high resistance. In addition, because the light emitting device 108 of the present embodiment does not include a structure in which the upper and lower parts of the light emitting layer 120 including a quantum dot are sandwiched by a pair of electrodes, it is possible to prevent short circuiting due to defects in the light emitting layer 120.

As described above, the light emitting device related to one embodiment of the present invention can suppress variations in light intensity without relying on the film thickness of the light emitting layer. In addition, because a pair of electrodes is provided on the opposite side of a light emitting surface of the light emitting layer, it is possible to achieve effective use of light emitted from the light emitting layer. Furthermore, because it is possible to significantly reduce the manufacturing problems of short circuit defects caused by impurities entering between the electrodes, it is possible to manufacture a product with a high yield.

It is possible to make the light luminosity over the entire pixel region (that is, display screen) uniform by arranging the light emitting device related to the present embodiment in a pixel of a display device. In addition, it is possible to make the light emitting spectrum peak sharp and emit light with high purity by including a quantum dot in the light emitting layer.

Modified Example 1

With regards to the insulation layer 112 in the light emitting device 108 shown in FIG. 1, it is possible to use a stronger electric field from the first electrode 110 by adopting a structure in which the insulation layer 112 is removed apart from the lower part of the second electrode 114. Furthermore, by removing the insulation layer 112, the light reflected by the surface of the first electrode 110 no longer passes through the insulation layer and it is possible to further improve light emitting efficiency since there is no longer any transmittance loss.

Modified Example 2

Figure 3:
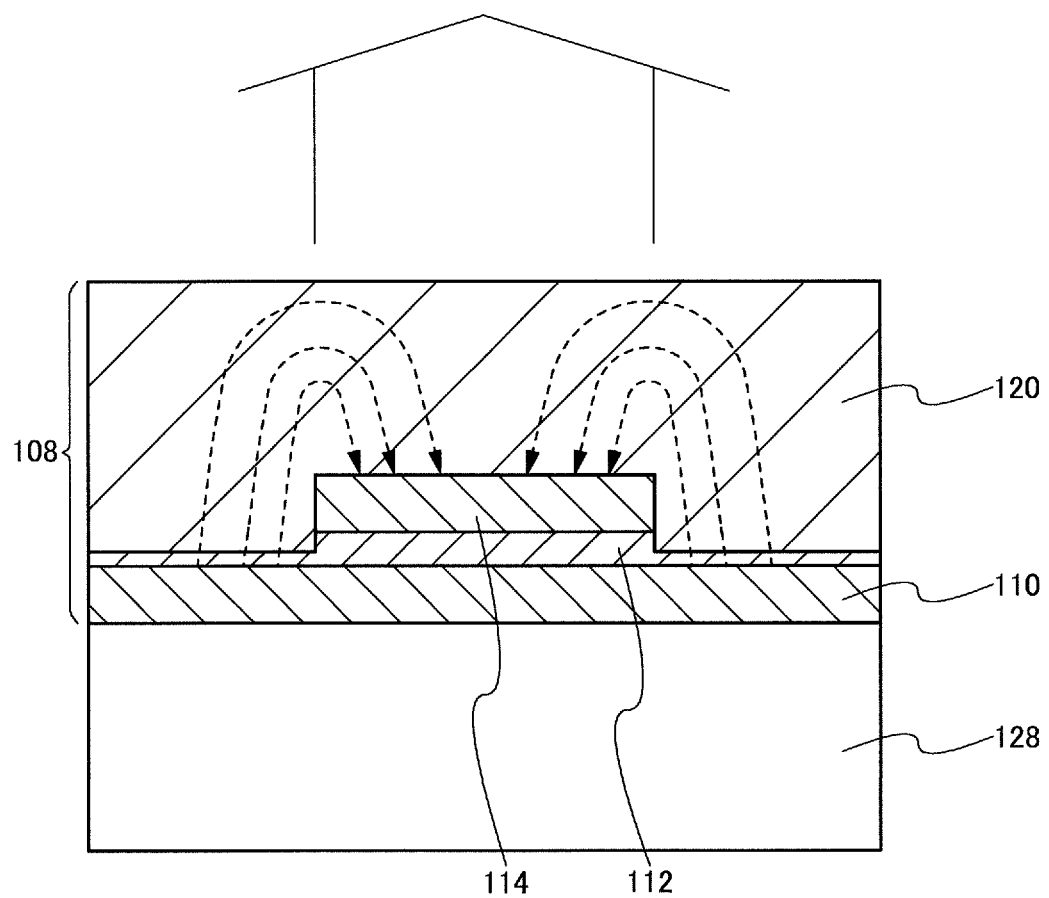
FIG. 3 is a cross-sectional diagram showing a structure of a light emitting device related to one embodiment of the present invention.
Figure 4:
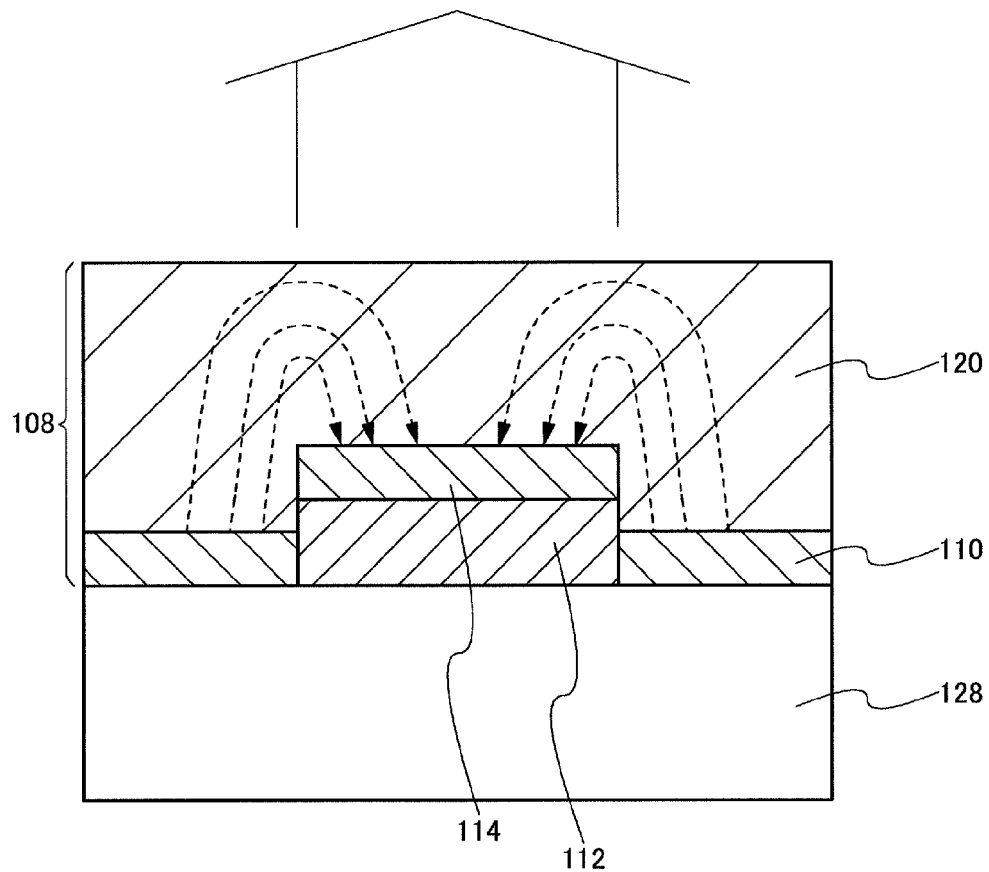
FIG. 4 is a cross-sectional diagram showing a structure of a light emitting device related to one embodiment of the present invention.

As is shown in FIG. 3 for example, the insulation layer 112 is thick at the lower part of the second electrode 114 and is thin above the first electrode 110 where the second electrode 114 does not exist. By adopting this structure, it is possible to for the Fowler-Nordheim tunneling electrons to be more easily discharged with to the light emitting layer 120 via the insulation layer 112 from the first electrode 110.

Modified Example 3

Figure 5:
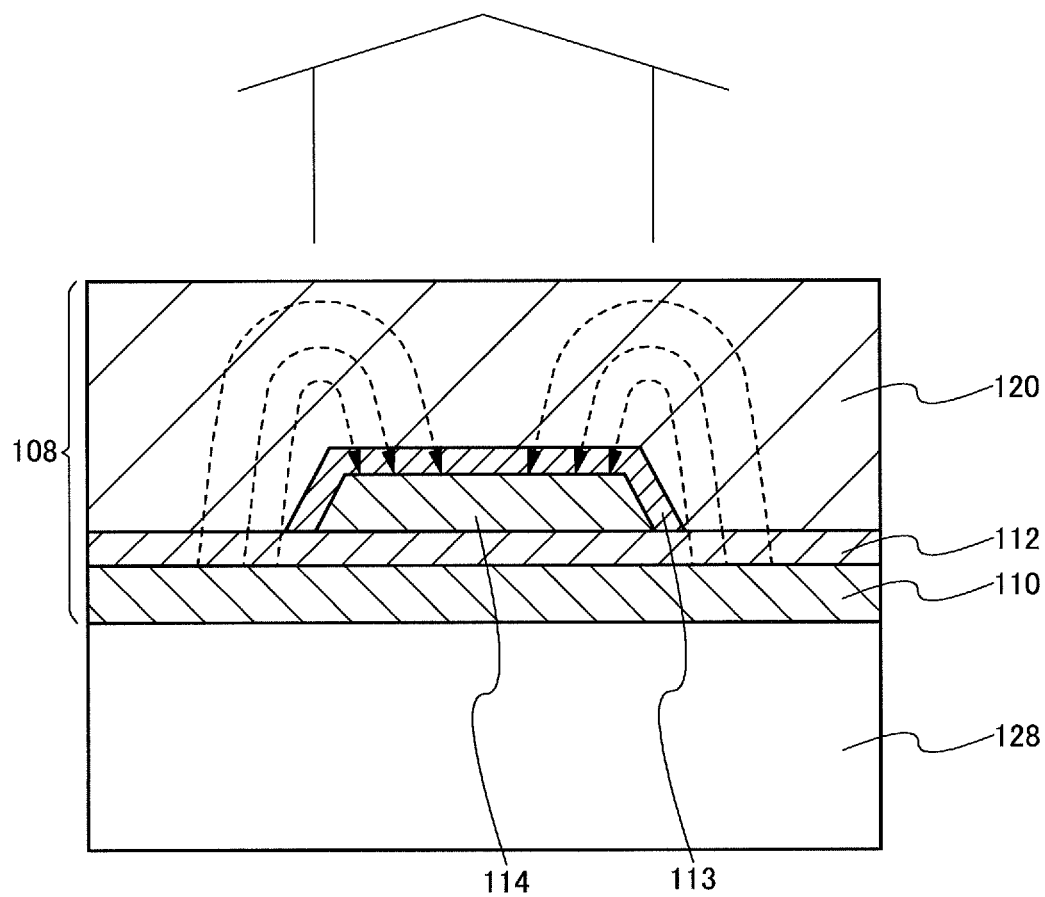
FIG. 5 is a cross-sectional diagram showing a structure of a light emitting device related to one embodiment of the present invention.

As is shown in FIG. 5, the first electrode 110 may be formed on both sides of the insulation layer 112 on the lower part of the second electrode 114. By adopting this structure it is possible to further strengthen a fringe electric field.

Modified Example 4

As is shown in FIG. 5, an insulation layer 113 may also be provided on an upper part and a side surface of the second electrode 114. By adopting this structure it is possible to protect the fringe electric field from a solution when forming the light emitting layer 120.

Modified Example 5

Figure 6:
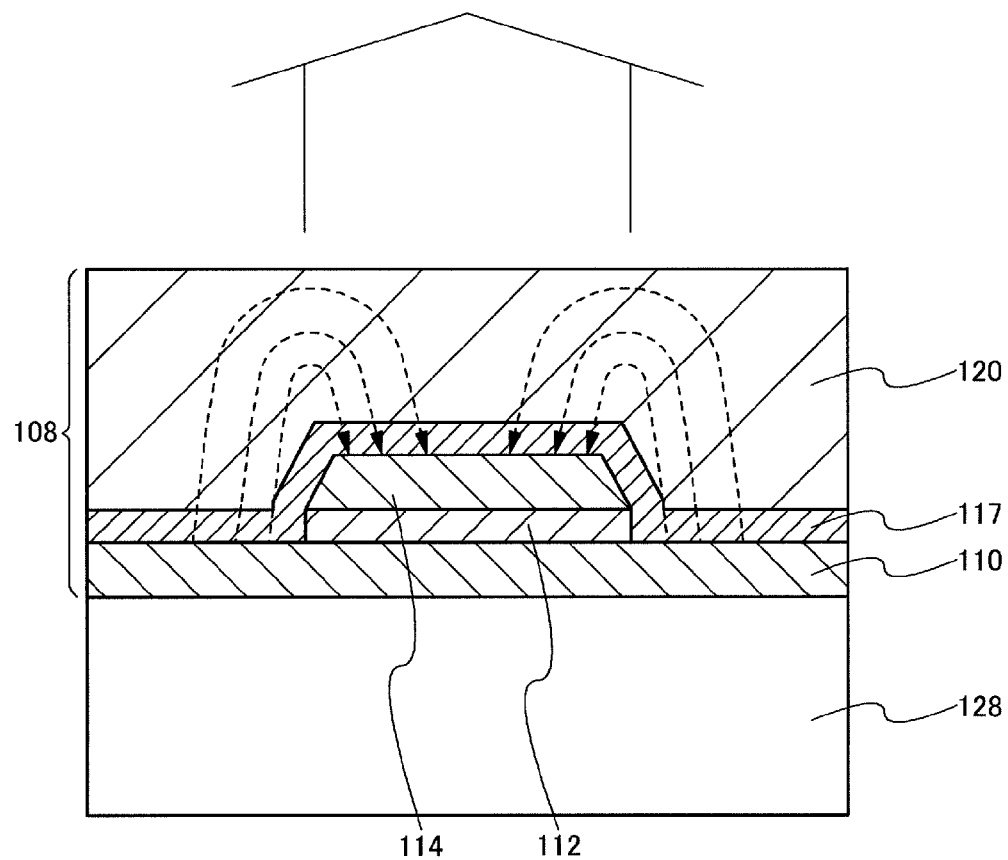
FIG. 6 is a cross-sectional diagram showing a structure of a light emitting device related to one embodiment of the present invention.

As is shown in FIG. 6, a carrier injection layer and transport layer 117 may be formed above the second electrode 114, above the side surface of the insulation layer 112 and above the first electrode 110 where the second electrode 114 is not formed. By adopting this structure, it is possible to increase carrier production by the carrier injection layer and transport layer 117 more efficiently by using the fringe electric field and more efficiently emit light.

Second Embodiment

Structure of a Display Device

The present embodiment shows an example of a display device comprised from a pixel using the light emitting device shown in the first embodiment.

Figure 7:
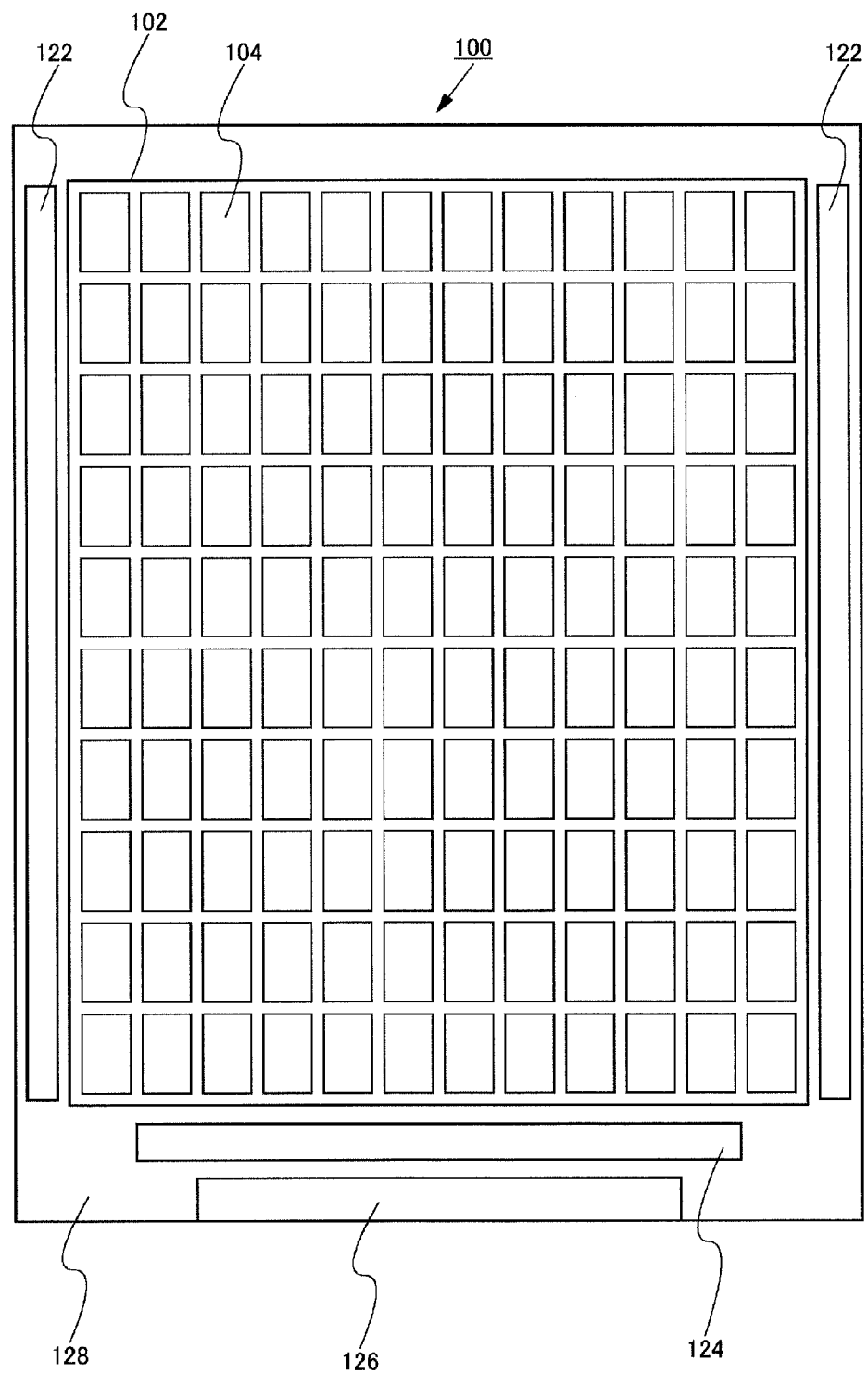
FIG. 7 is a diagram showing a structure of a display device related to one embodiment of the present invention.

An example of a display device 100 related to the present embodiment is shown in FIG. 7. The display device 100 includes a pixel part 102 provided with a plurality of pixels 104 above a substrate 128, a scanning line drive circuit 122 for inputting a signal to the pixel part 102, a data line drive circuit 124, and an input terminal part 126. A light emitting device including the structure shown in the first embodiment is provided in the pixel 104. Emitted light of the light emitting device provided in a pixel is controlled by a scanning signal output from the scanning line drive circuit 122 and a data signal synchronized with the scanning signal and output from the data line drive circuit 124.

Figure 8A:
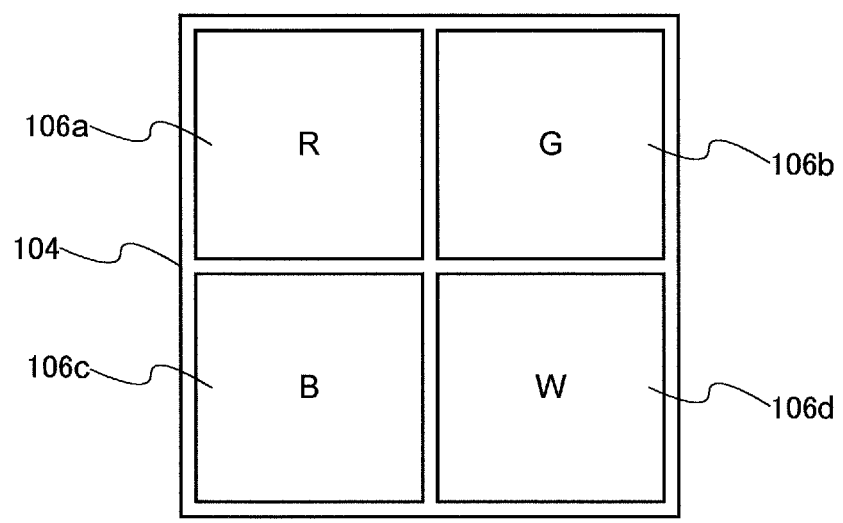
FIG. 8A shows an example of a structure in which four sub-pixels are provided in a square in one pixel as a structure of a pixel related to one embodiment of the present invention.
Figure 8B:
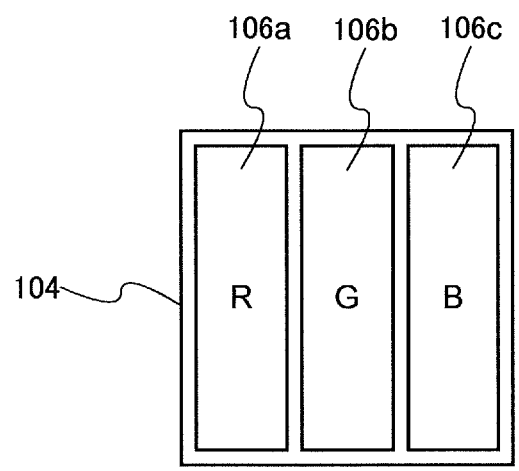
FIG. 8B shows an example of a structure in which three sub-pixels are provided in a stripe in one pixel as a structure of a pixel related to one embodiment of the present invention.

FIGS. 8A and 8B show an example of a pixel 104 provided in the pixel part 102. The pixel 104 shown in FIGS. 8A and 8B shows an example of configuring a pixel using a plurality of sub-pixels. FIG. 8A shows an example in which in addition to a first sub-pixel 106a corresponding to red, second sub-pixel 106b corresponding to green, third sub-pixel 106c corresponding to blue, a fourth sub-pixel 106d corresponding to white is also provided in a square configuration in one pixel 104. FIG. 8B shows an example in which first sub-pixel 106a corresponding to red, second sub-pixel 106b corresponding to green and third sub-pixel 106c corresponding to blue are provided in a stripe shape in one pixel 104.

In the display device related to the present embodiment, although the arrangement and structure of the sub-pixels is arbitrary, by arranging one pixel by combining sub-pixels corresponding to different colors, it is possible to perform a color display.

FIG. 9A shows a planar view of a pixel 104 provided with the first sub-pixel 106a, second sub-pixel 106b and third sub-pixel 106c. The first electrode 110 (first electrode 110a, first electrode 110b, first electrode 110c) is provided in each of the sub-pixels 106 (first sub-pixel 106a, second sub-pixel 106b, third sub-pixel 106c). The first electrode 110 (first electrode 110a, first electrode 110b, first electrode 110c) includes a contact part 134 (contact part 134a, contact part 134b, contact part 134c) respectively. The first electrode 110 (first electrode 110a, first electrode 110b, first electrode 110c) is connected to a control device via the contact part 134 (contact part 134a, contact part 134b, contact part 134c) respectively and includes a structure in which the potential of each is separately controlled.

A second electrode 114 is provided via an insulation layer on an upper part of the first electrode 110 (first electrode 110a, first electrode 110b and first electrode 110c). The second electrode 114 is provided as an electrode common with the first sub-pixel 106a, second sub-pixel 106b and third sub-pixel 106c.

The second electrode 114 includes a strip shaped or lattice shaped pattern. The shape of the second electrode 114 can be understood as a combination of a line shaped grid electrode 118 extending above the first electrode 110 and a bus electrode 116 extending to the first electrode 110 and connected with the grid electrode 118. The second electrode 114 having this form is provided so as to overlap the first electrode 110 (first electrode 110a, first electrode 110b, first electrode 110c) in each pixel 106.

Figure 9:
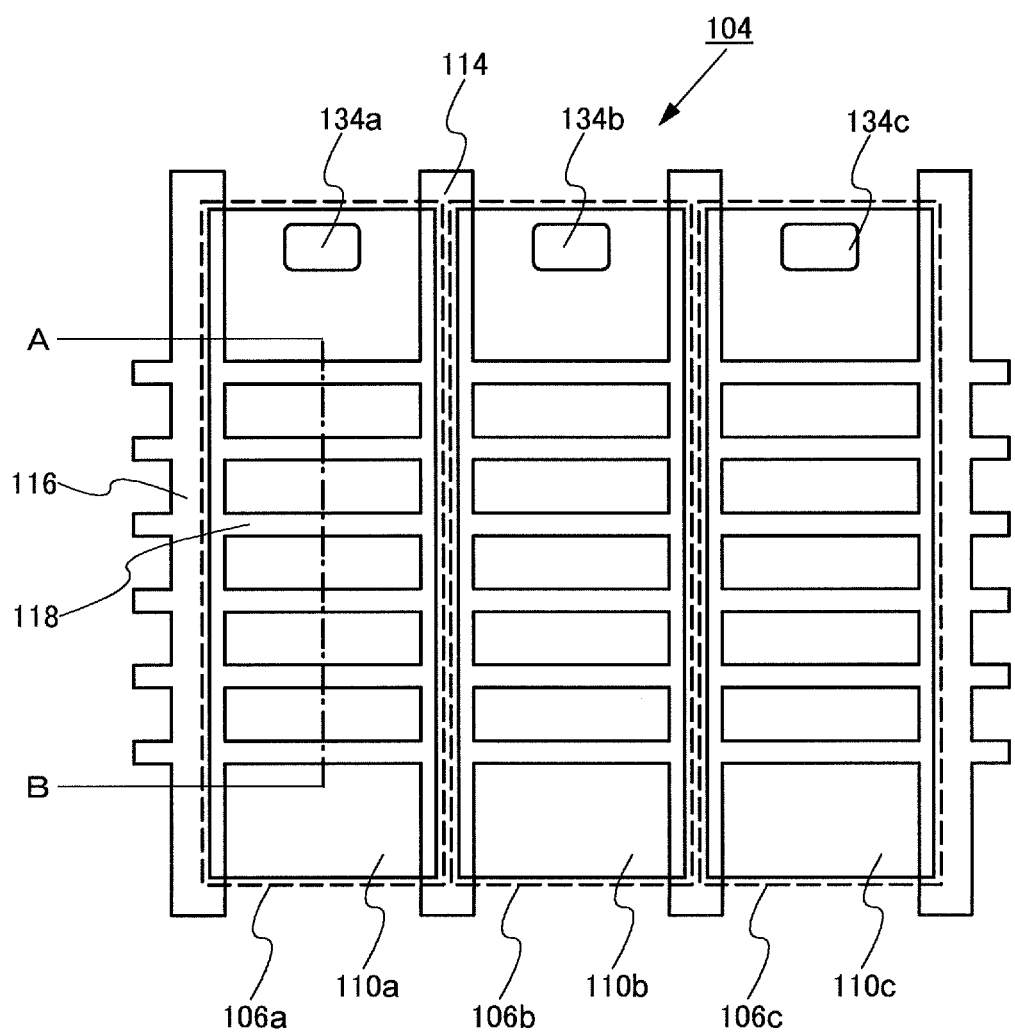
FIG. 9 is a planar view diagram showing a structure of a pixel related to one embodiment of the present invention.
Figure 10:
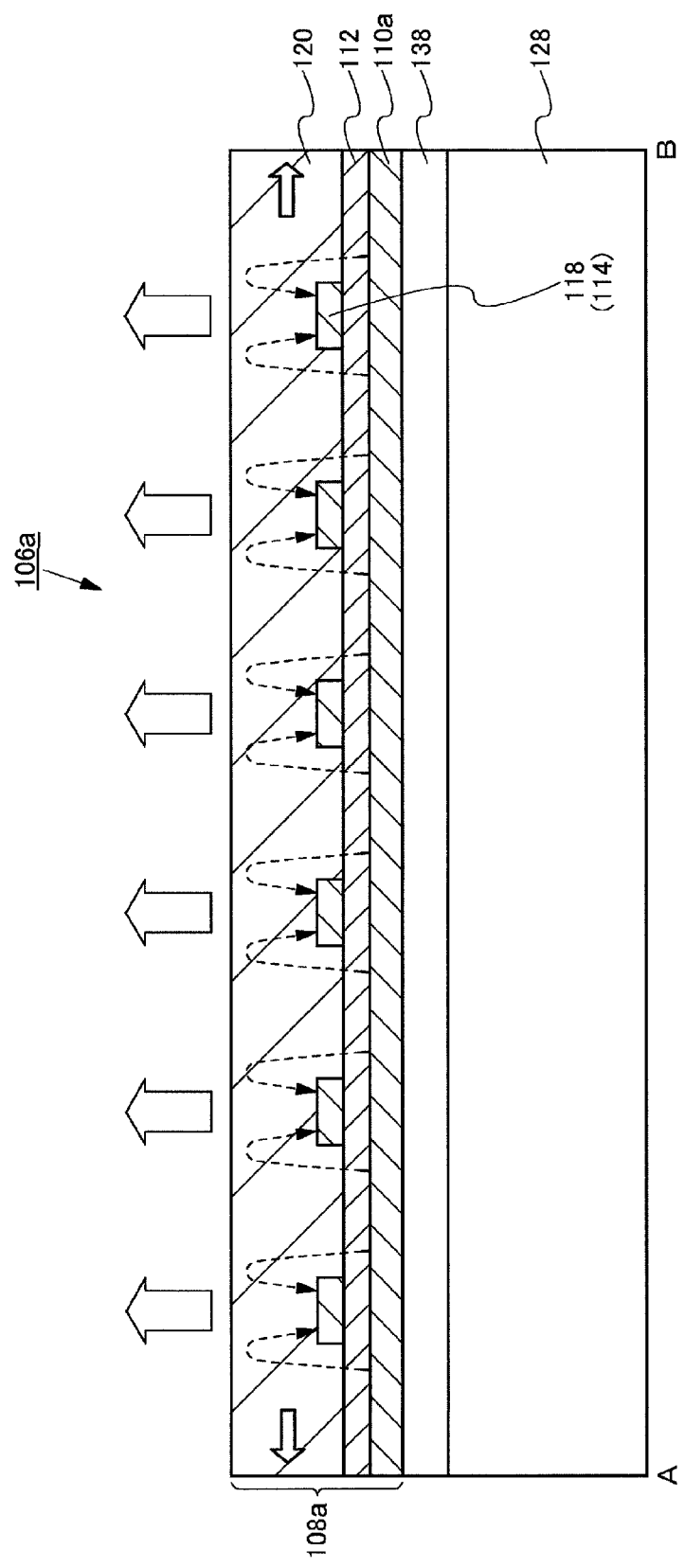
FIG. 10 is a cross-sectional diagram showing a structure of a pixel related to one embodiment of the present invention.

A cross-sectional structure of the first sub-pixel 106a corresponding to the line A-B shown in FIG. 9 is shown in FIG. 10. As is shown in FIG. 10, the insulation layer 112 is provided on an upper part of the first electrode 110a in the first sub-pixel 106a. The second electrode 114 is provided so as to overlap the first electrode 110a sandwiching the insulation layer 112. The light emitting layer 120 including a quantum dot is provided in an upper surface part of the insulation layer 112. The light emitting device 108a provided in the first sub-pixel 106a. In this way, the second electrode 114 is covered by the light emitting layer 120. The light emitting device 108a provided in the first sub-pixel 106a includes a structure in which the first electrode 110a, insulation layer 112, second electrode 114 and light emitting layer 120 are stacked and this structure is the same as the light emitting device explained in the first embodiment. Furthermore, the structure of the second sub-pixel 106b and third sub-pixel 106c is also the same.

In FIG. 10, a fringe electric field generated by the first electrode 110a and grid electrode 118 (one part of the second electrode 114) is distributed widely across the light emitting layer 120 including a quantum dot. In FIG. 10, a fringe electric field generated by the first electrode 110a and grid electrode 118 (one part of the second electrode 114) is shown schematically by a dotted line. The light emitting layer 120 emits light when an electric field is applied to the light emitting layer 120 including a quantum dot. By combining the second electrode 114 with the grid electrode 118 and bus electrode 116 and by adopting a certain pattern such as a strip shape or lattice shape, it is possible to distribute a fringe electric field above the first electrode 110a and thereby excite a surface shaped emitted light. The emitted light intensity of the light emitting device 108a is controlled not only by the electric field between the first electrode and second electrode but also by the planar shape of the second electrode and it is possible to control the light emitting intensity of a pixel and emitted light distribution.

The light emitted by the light emitting layer 120 is emitted from the surface on the opposite side to the surface provided with the first electrode 110a and grid electrode 118 (one part of the second electrode 114). Since the light emitted by the light emitting layer 120 is irradiated in all directions, light is directly emitted from this emitting surface and also to the first electrode 110a side. The light irradiated the first electrode 110a is reflected by forming the first electrode 110a using a metal such as aluminum (Al) or silver (Ag) and it is possible to emit light from the light emitting surface of the light emitting layer 120. In this way, it is possible to effectively extract light emitted by the light emitting layer 120 by using the first electrode 110 as a reflection surface.

Furthermore, the first electrode 110 may be formed by stacking a plurality of conducing films in addition to a single layer of metal. For example, a transparent conductive film such as ITO may be used as the uppermost layer and below this, a light reflective surface may be provided by provided a metal layer.

In addition, when at least the grid layer 118 (one part of the second electrode 114) is a metal, it is possible to reflect the light emitted from the light emitting layer 120. In addition, in the case where the grid electrode 118 (one part of the second electrode 114) is formed from a transparent conductive film, the light irradiated from the light emitting layer 120 can pass through the second electrode 114 and be reflected by the reflective surface of the first electrode 110a.

Furthermore, one part of the light emitted by the light emitting layer 120 is way-guided through the interior of the light emitting layer 120 and is also dispersed in a horizontal direction. In the case where the first electrode 110a and the second electrode 114 are metal, a part of the light that multiple reflected and wave-guided within the light emitting layer 120 can be diffused reflected by the metal surface and emitted to the exterior from the light emitting layer 120. The second electrode 114 formed in a certain pattern by a combination of the grid electrode 118 and bus electrode 116 is effective in scattering wave-guided light. On the other hand, in the case where the second electrode 114 is formed from a transparent conductive film, it is possible to allow the light reflected by the first electrode 110 to pass through and emit the light to the exterior.

Although the first sub-pixel 106a was explained in FIG. 10, the structure of the second sub-pixel 106b and third sub-pixel 106c is also the same. In either case, since an electrode does not exist on the light emitting side of the light emitting layer 120 including a quantum dot, the light emitting device 108 related to the present embodiment can reduce the effects of light absorption or reflection due to an electrode and reduce parts that cause a shadow due to an electrode and thereby it is possible to increase light extraction efficiency.

Figure 11:
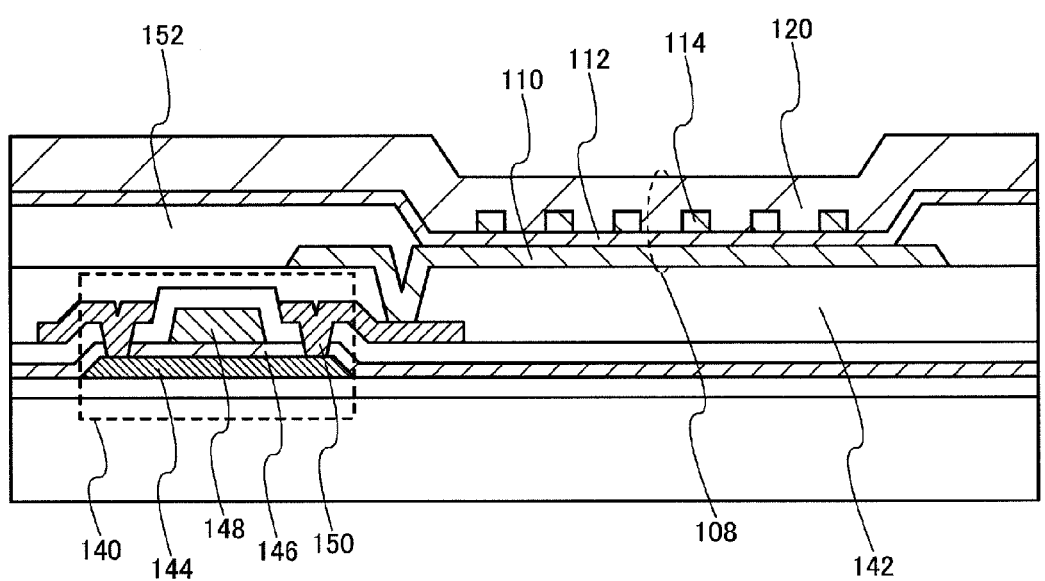
FIG. 11 is a cross-sectional diagram showing a structure of a pixel related to one embodiment of the present invention.

In addition, in FIG. 10, an insulation layer 138 may be provided between the first electrode 110 and the substrate 128 and on a lower layer side of this a device and wiring may be formed for forming a pixel circuit. FIG. 11 shows a structure in which the light emitting device 108 is connected with a control device 140 for forming a pixel circuit.

The light emitting device 108 shown in FIG. 11 shows a structure the same as that shown in FIG. 10. An interlayer insulation film 142 may be provided between the control device 140 and the light emitting device 108. The first electrode 110 in the light emitting device 108 is connected with a source/drain electrode 150 of the control device 140 by a contact hole part 134a provided in the interlayer insulation film 142. An interval wall 152 may be provided on a periphery edge of the first electrode 110 and a step produced by the first electrode 110 and contact hole part 134a is buried by the interval wall 152.

The potential of the first electrode 110 is controlled by the control device 140. The control device 140 comprises a semiconductor layer 144 and a gate electrode 148. The semiconductor layer 144 and the gate electrode 148 are insulated by a gate insulating layer 146. The control device 140 is embodied by a field-effect transistor. Specifically, a gate voltage is applied to the semiconductor layer 144 which is formed from amorphous or polycrystalline silicon or an oxide semiconductor and a thin film transistor with channels is formed.

As is shown in FIG. 11, it is possible to provide a light emitting device including a light emitting layer having a quantum dot, and a transistor connected with the light emitting device above the same substrate. By using such as transistor, it is possible to provide a pixel circuit for controlled light emitted in each pixel and a drive circuit which provides a drive signal to a pixel above a substrate.

<Pixel Circuit>

Figure 12A:
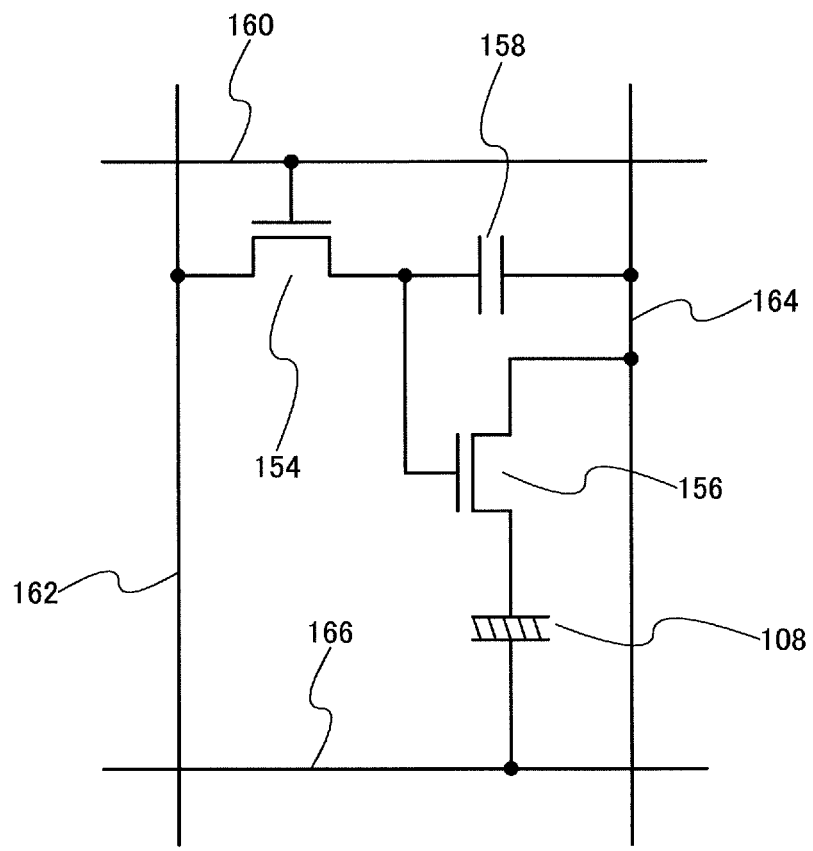
FIG. 12A shows an example of a pixel circuit related to one embodiment of the present invention.
Figure 12B:
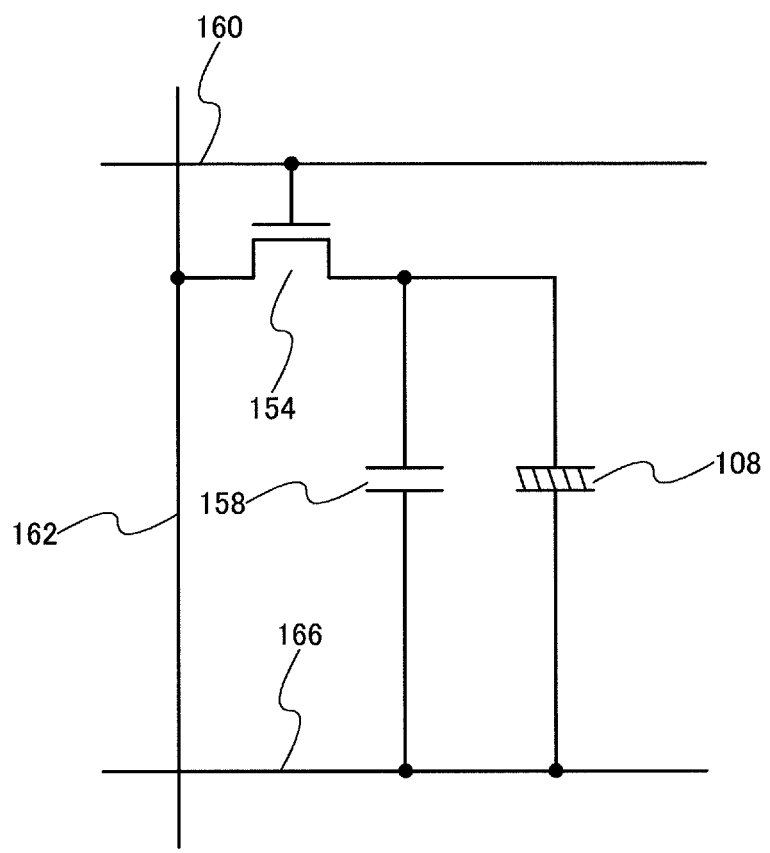
FIG. 12B shows an example of a pixel circuit related to one embodiment of the present invention.

FIG. 12A and FIG. 12B show an example of a pixel example which can be applied to the display device of the present embodiment.

FIG. 12A shows one example of a pixel circuit. The pixel circuit is including a selection transistor 154 and a driving transistor 156. The selection transistor 154 is switched by the scanning signal applied to the scanning signal line 160. The gate of the driving transistor 156 is applied data signal potential of a data signal line 162 when the selection transistor 154 is turned on by switched. The drive transistor 156 is connected between a power supply line 164 and the light emitting device 108. The gate potential of the drive transistor 156 is held by a capacitor device 158. The light emitting device 108 is a 2-terminal device and when explained corresponding to the light emitting device 108 explained in FIG. 9 and FIG. 10, has a structure whereby the first electrode side is connected to the drive transistor 156 and the second electrode is connected to a common potential line 166. In the present embodiment, provided the light emitting element has a sandwiched insulating layer between the first electrode and the second electrode. Therefore, the light emitting device may be regarded as a capacitive element.

FIG. 12B shows a pixel circuit with a structure in which a potential provided from the selection transistor 154 is directly provided to the light emitting device 108 and this potential is held by the capacitor device 158. In this way, the light emitting device 108 of the present embodiment can control emitted light by the selection device 154 and the drive transistor 156 can be omitted.

<External Appearance of a Display Device>

Figure 13:
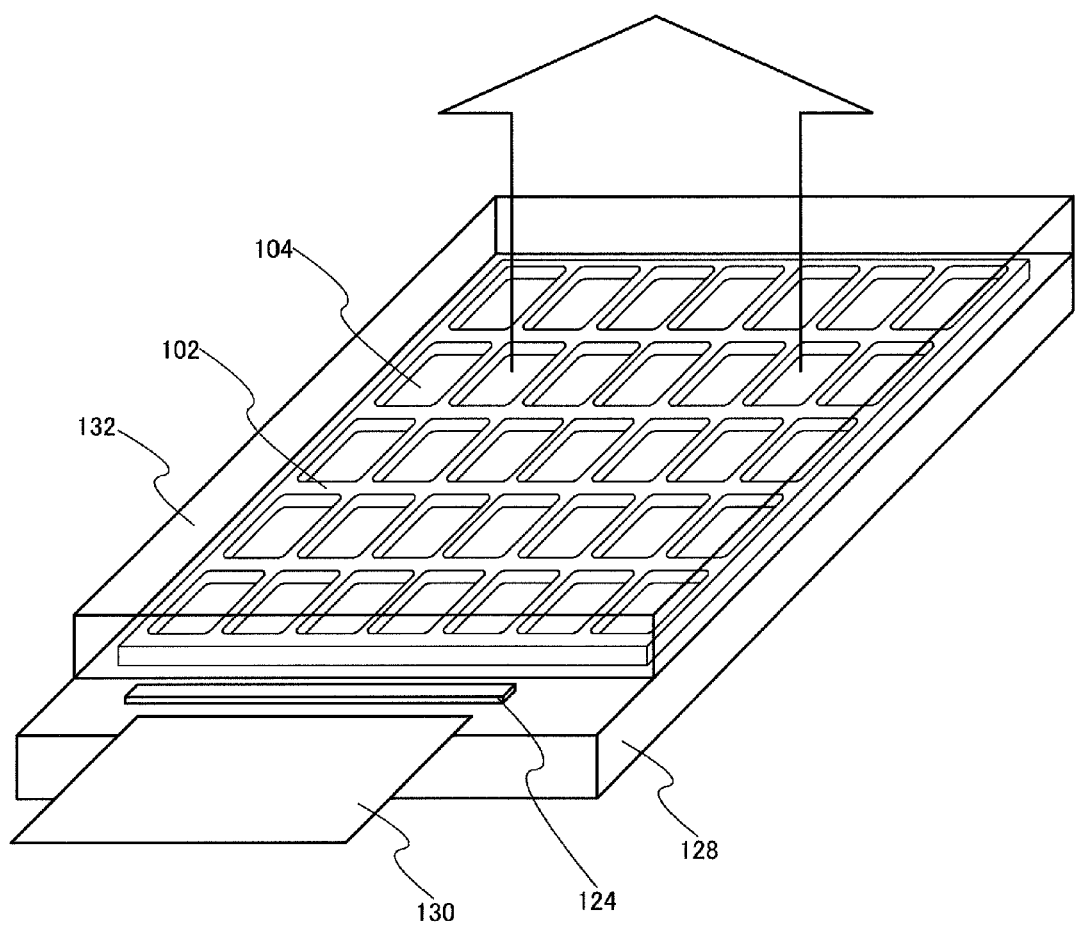
FIG. 13 is a perspective view diagram showing a structure of a display device related to one embodiment of the present invention.

FIG. 13 is a perspective view showing a structure of a display device related to the preset embodiment. FIG. 13 shows a form in including a substrate 128 provided with a pixel part 102, data line drive circuit 124 and flexible printed substrate 130, and a sealing substrate 132 provided so as to overlap the pixel part 102.

The emitted light of the pixel 104 in the pixel part 102 has a top emission type structure emitted to the sealing substrate 132 side. Although a passivation film or sealing substrate is sometimes provided on an upper surface of the light emitting layer 120, since an electrode does not exist on the light emitting surface, it is possible to ensure there are no effects due to absorption or reflection caused by an electrode and ensure a part which becomes a shadow due to an electrode does not exists, it is possible to increase the aperture ratio of a pixel.

<Structure of a Pixel Part>

Figure 14:
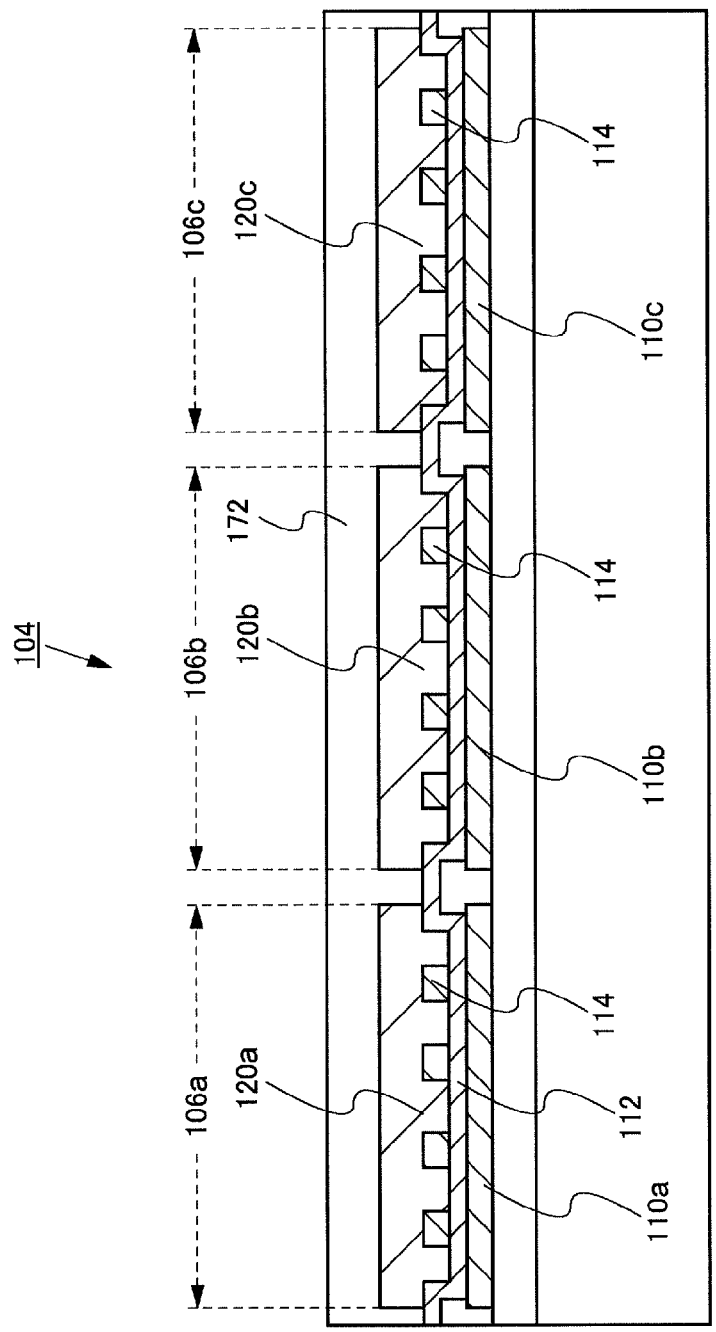
FIG. 14 is a cross-sectional diagram showing a structure of a pixel related to one embodiment of the present invention, and is a diagram showing an example in which a light emitting device with different light emitting wavelengths is provided in each sub-pixel.

FIG. 9 shows an example in which the first sub-pixel 106a corresponding to red, second sub-pixel 106b corresponding to green and third sub-pixel 106c corresponding to blue are provided. The color of the emitted light of each pixel can be controlled by the composition of a quantum dot included in the light emitting layer 120 and by make the sizes of the particles different. FIG. 14 shows an example of a light emitting layer with different colors of emitted light in each sub-pixel.

In FIG. 14, the first electrode 110a is provided in the first sub-pixel 106a, the second electrode 110b is provided in the second sub-pixel 106b, and the third electrode 110c is provided in the third sub-pixel 106c respectively. The second electrode 114 (grid electrode 118) is provided as an electrode providing a common potential to the first to third sub-pixels. The insulation layer 112 between the first electrode 110 and the second electrode 114 (grid electrode 118) is provided so as to cover the first electrode 110a, the first electrode 110b and first electrode 110c.

The first light emitting layer 120a is provided in the first sub-pixel 106a, the second light emitting layer 120b is provided in the second sub-pixel 106b and the third light emitting layer 120c is provided in the third sub-pixel 106c respectively. Each of the first light emitting layer 120, second light emitting layer 120b and third light emitting layer 120c include a quantum dot with different particle diameters and the wavelength of the emitted light is adjusted. For example, a quantum dot may be selected so that the first light emitting layer 120a emits red light, the second light emitting layer 120b emits green light and the third light emitting layer 120c emits blue light.

In this way, according to the structure of the pixel 104 shown in FIG. 14, it is possible to form a pixel which emits light with high color purity by provided a light emitting layer including a quantum dot corresponding to each color.

Figure 15:
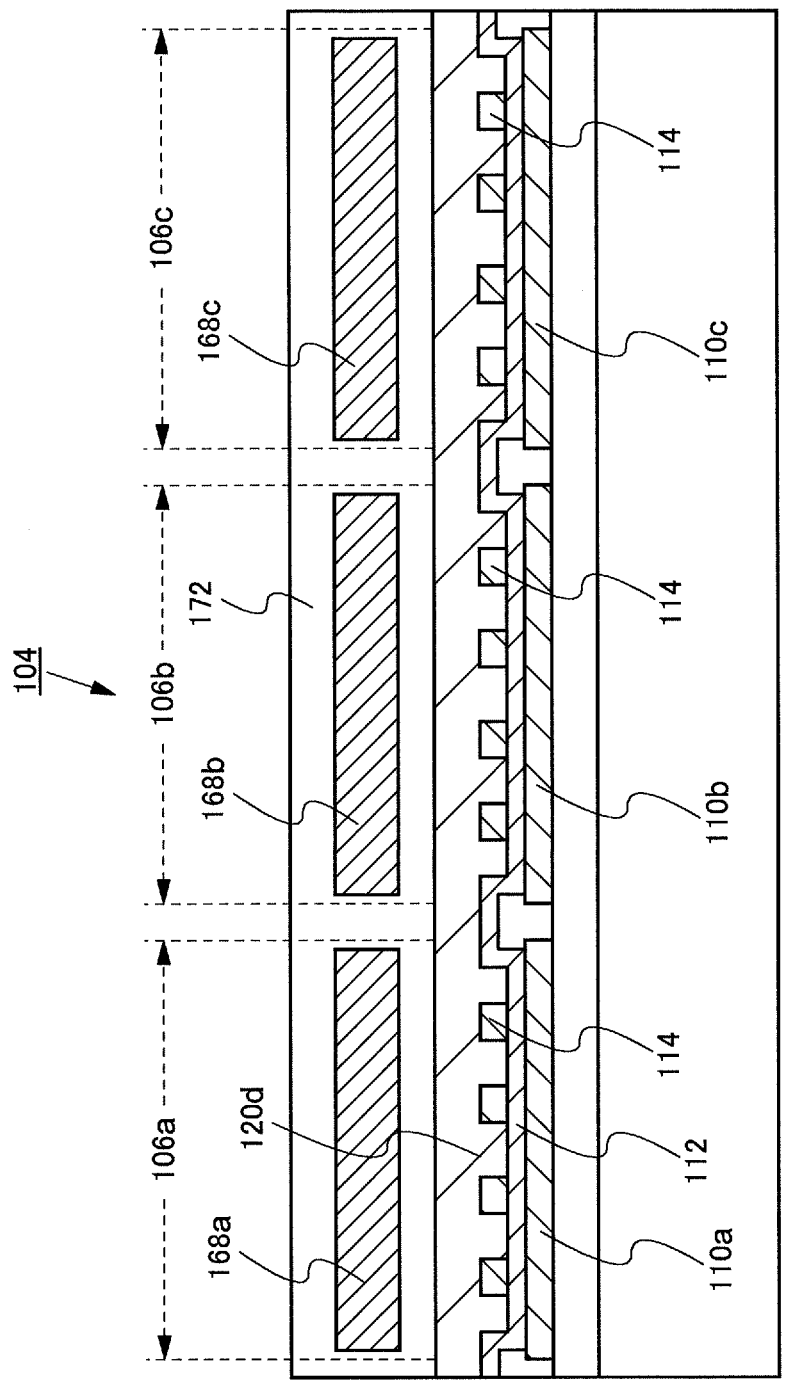
FIG. 15 is a cross-sectional diagram showing a structure of a pixel related to one embodiment of the present invention, and is a diagram showing an example in which a color filter is provided in each sub-pixel.

FIG. 15 shows an example of a pixel structure in which a light emitting layer 120d which emits white light is provided in common with the first sub-pixel electrode 106a, second sub-pixel electrode 106b and third sub-pixel electrode 106c, and a first color filter layer 168a corresponding to red, a second color filter layer 168b corresponding to green and a third color filter layer 168c corresponding to blue are provided with respect to each sub-pixel. According to the structure in FIG. 15, since it is not necessary to provide a light emitting layer separately for each sub-pixel, manufacture of the light emitting layer becomes easy.

Figure 16:
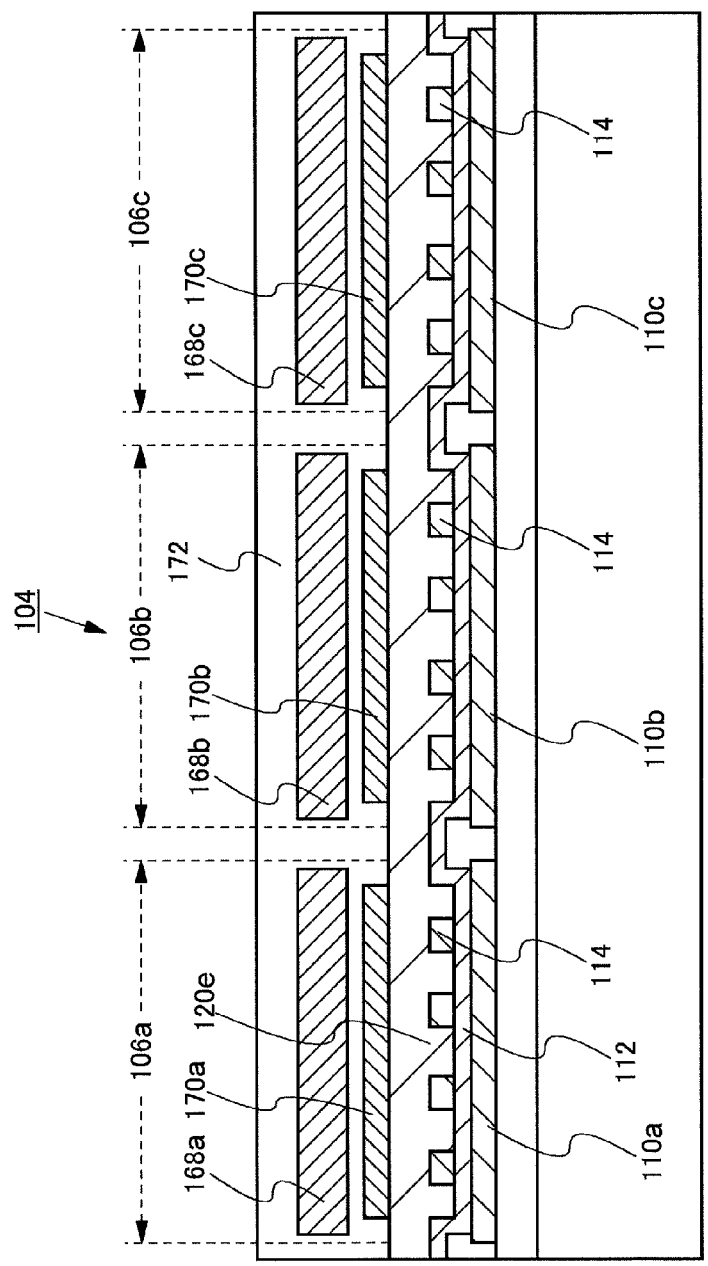
FIG. 16 is a cross-sectional diagram showing a structure of a pixel related to one embodiment of the present invention, and is a diagram showing an example in which a color filter and a color conversion layer are provided in each sub-pixel.

FIG. 16 shows an example whereby a light emitting layer 120e which emits blue light or infrared light is provided in common with each pixel. A first color conversion layer 170a is corresponding to red, a second color conversion layer 170b corresponding to green and a third color conversion layer 170c corresponding to blue are provided according to each pixel above the light emitting layer 120e. Light corresponding to each color is emitted from the color conversion layers by irradiating blue light or infrared light emitted from the light emitting layer 120e to each color conversion layer. A color filter layer 168 (first color filter layer 168a corresponding to red, first color filter layer 168b corresponding to green, first color filter layer 168c corresponding to blue) may be further combined in order to increase the color purity of the light emitted from the color conversion layers. In addition, the color conversion layers can convert light to white or light close to white and be provided so as to be linked with each sub-pixel.

According to FIG. 14, FIG. 15 and FIG. 16, the common structure of the light emitting device of each sub-pixel allows making the wavelength of the light emitted from a pixel different according to the composition of a quantum dot in each light emitting layer, by making the particle size different, or by provided a single color light emitting layer in each sub-pixel and by using a color filter layer and/or color conversion layer.

As described above, the display device related to the present embodiment can display an image by arranging a pixel with above described structure in a pixel part. In this case, the light emitting intensity of a light emitting device in each pixel can be controlled by the potential difference between a first electrode and second electrode without depending on the film thickness of a light emitting layer if the film thickness of an insulation layer provided between the first electrode and second electrode is constant. Therefore, it is possible to avoid any bad effects even if the film thickness of a light emitting layer varies. As a result, it is possible to reduce variation in light emitting luminosity even if a pixel part of the display device, that is, even if the area of a display screen is enlarged.

In addition, since it is possible to make the peak of a light emitting spectrum is sharp and emit light with a high color purity by including a quantum dot in a light emitting layer, it is possible to display a vivid image. Furthermore, by adopting a structure in which a light emitting device of each pixel is not provided with an electrode in an upper surface part of a light emitting layer which includes a quantum dot, it is possible to increase the light emitting efficiency and light extraction efficiency an achieve low power consumption of a display device.

Modified Example 6

Figure 17:
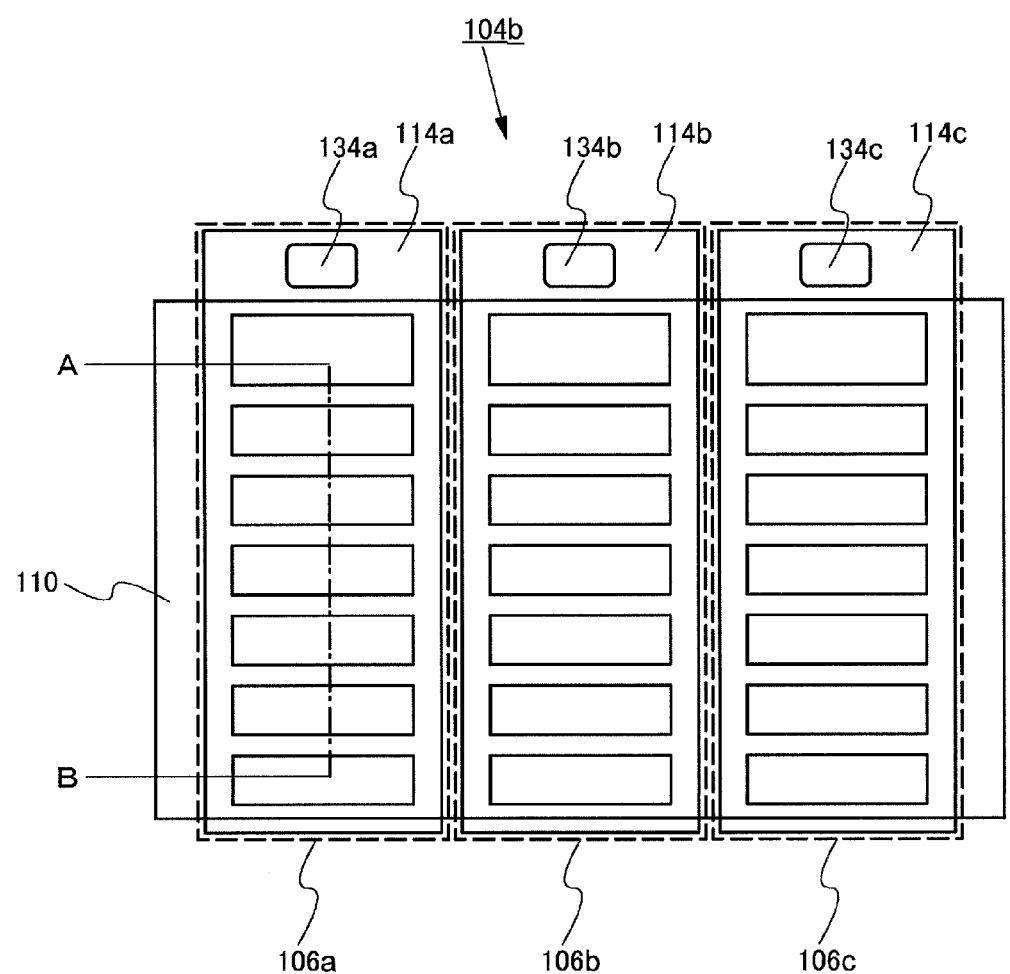
FIG. 17 is a planar view diagram showing a structure of a pixel related to one embodiment of the present invention.

FIG. 17 shows another example of a pixel that can be applied to a display device in the present embodiment. The pixel 104b shown in FIG. 17 is provided with a first sub-pixel 106a corresponding to red, a second sub-pixel 106b corresponding to green and a third sub-pixel 106c corresponding to blue adjacent to each other. However, the first electrode 110 is provided so these sub-pixels are shared. On the other hand, the second electrode 114a, second electrode 114b and second electrode 114c are individually provided in each sub-pixel and a potential is individually controlled by connecting with a control device in each respective contact hole part 134 (contact hole part 134a, contact hole part 134b, contact hole part 134c).

According to the structure of the pixel 104b shown in FIG. 17, because the first electrode 110 is formed using a low resistance metal material such as aluminum (Al) or silver (Ag) as a reflective electrode, it is possible to reduce the effects of electrode resistance even in the case where the area of the first electrode 110 is expanded larger than the expanded area of a pixel part. On the other hand, since the second electrode 114 (second electrode 114a, second electrode 114b, second electrode 114c) is provided as an individual electrode with respect to each sub-pixel, it is possible to ensure that the electrode is hardly affected by electrode resistance even when a transparent conductive film is used. Furthermore, it is possible to allow the light from light emitting layer reflected by the first electrode 110 to pass through the second electrode 114 (second electrode 114a, second electrode 114b, second electrode 114c) and be emitted.

The cross-sectional structure of a pixel along the line A-B shown in FIG. 17 is the same as that shown in FIG. 10. Similar to the pixel shown in FIG. 9, it is possible to adjust the light intensity of a light emitting device by an interval between the first electrode and second electrode, that is, by adjusting the thickness of an insulation layer provided between the first electrode and second electrode and by a pattern of the second electrode without the pixel 104b shown in FIG. 17 receiving the effects of film thickness of a light emitting layer.

Modified Example 7

Figure 18:
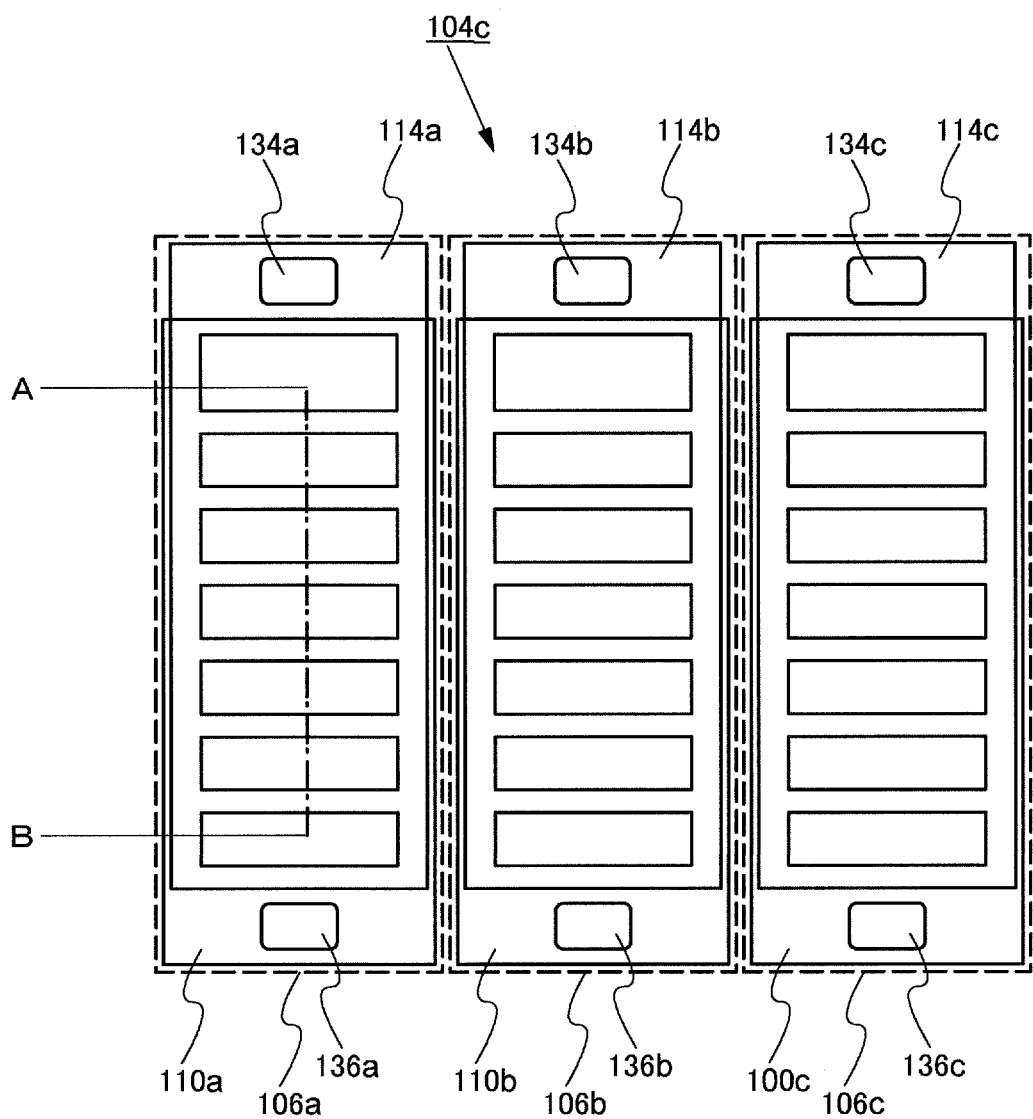
FIG. 18 is a planar view diagram showing a structure of a pixel related to one embodiment of the present invention.

FIG. 18 shows another example of a pixel that can be applied to a display device in the present embodiment. The pixel 104c shown in FIG. 18 is provided with a first sub-pixel 106a corresponding to red, a second sub-pixel 106b corresponding to green and a third sub-pixel 106c corresponding to blue adjacent to each other. In these sub-pixels, the first electrode 110 (first electrode 110a, first electrode 110b, first electrode 110c) and the second electrode 114 (second electrode 114a, second electrode 114b, second electrode 114c) is provided so that a potential is individually controlled in each sub-pixel. That is, in the first sub-pixel 106a, the first electrode 110a is connected with a control device via the contact hole part 134a, the second electrode 114a is connected with a control device via the contact hole part 136a and a potential is individually controlled. The same is the case in the second sub-pixel 106b, third sub-pixel 106c. Furthermore, the cross-sectional structure along the line A-B shown in FIG. 18 is the same as the structure shown in FIG. 10.

As is shown in FIG. 18, it is possible to more accurately control the light emitting intensity of each sub-pixel by individually controlling the potential of the first electrode and second electrode. Similar to the pixel shown in FIG. 9, it is possible to adjust the light intensity of a light emitting device by an interval between the first electrode and second electrode, that is, by adjusting the thickness of an insulation layer provided between the first electrode and second electrode and by a pattern of the second electrode without the structure of the pixel shown in FIG. 18 receiving the effects of film thickness of a light emitting layer.

Modified Example 8

In the present embodiment, the second electrode 114 is provided so that at least an end part of one part is provided to overlap in an upper part of the first electrode. When an end part of the second electrode 114 is provided in an upper part of the first electrode, it is possible to generate a fringe electrode field in the periphery of the second electrode when a potential difference is provided between electrodes. At this time, although the shape of the second electrode 114 is arbitrary, a chevron type structure may be provided in order to effectively generate a fringe electric field in the surface of a pixel and operate the field in the light emitting layer 120.

Figure 19A:
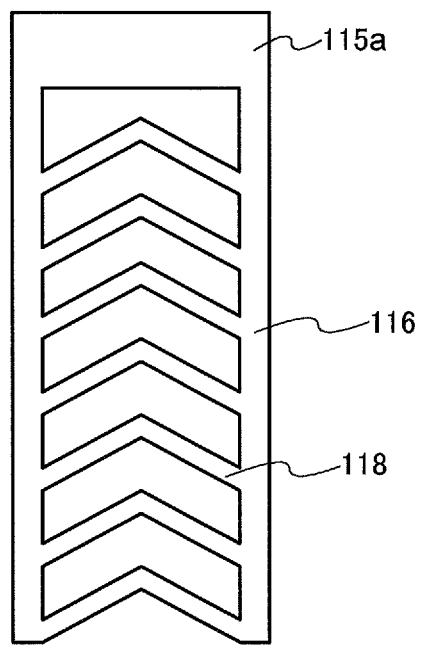
FIG. 19A is a planar view diagram showing a structure of an electrode provided in a pixel related to one embodiment of the present invention.
Figure 19B:
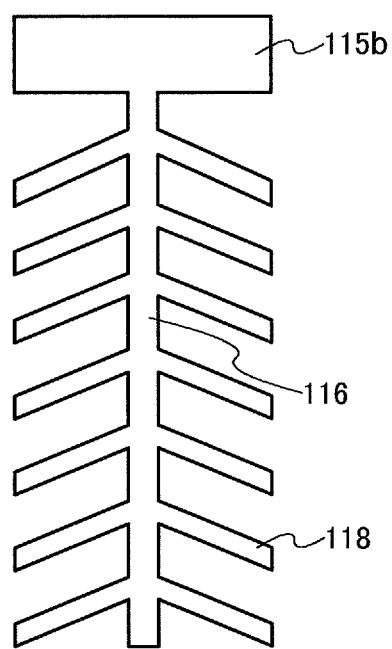
FIG. 19B is a planar view diagram showing a structure of an electrode provided in a pixel related to one embodiment of the present invention.

FIG. 19A and FIG. 19B show examples of a chevron type second electrode. The second electrode 115a shown in FIG. 19A includes a reverse V shaped form in which an oblique line spreads left and right when the roughly center part of a grid electrode 118 is a peak part. In addition, a bus electrode 116 extends to both sides of the grid electrode 118. In addition, the second electrode 115b shown in FIG. 19B has a form in which the bus electrode extends to the roughly center part of the reverse V shaped grid electrode 118 as a chevron type.

The second electrode 115a shown in FIG. 19A and the second electrode 115b shown in FIG. 19B can be used in place of the second electrode shown in FIG. 9, FIG. 17 and FIG. 18. According to the form of the second electrode shown in FIG. 19A and FIG. 19B, it is possible to improve visual angle characteristics. The place where the electric field intensity is strongest is on the edge sections of the second electrode. This edge section forms an area which light is emitted the strongest. This edge section also serves as an oblique section in the shape of the second electrode in FIG. 19A and FIG. 19B. In this way, visual angle characteristics are improved even when viewing a display from any diagonal direction.

Third Embodiment

Figure 20:
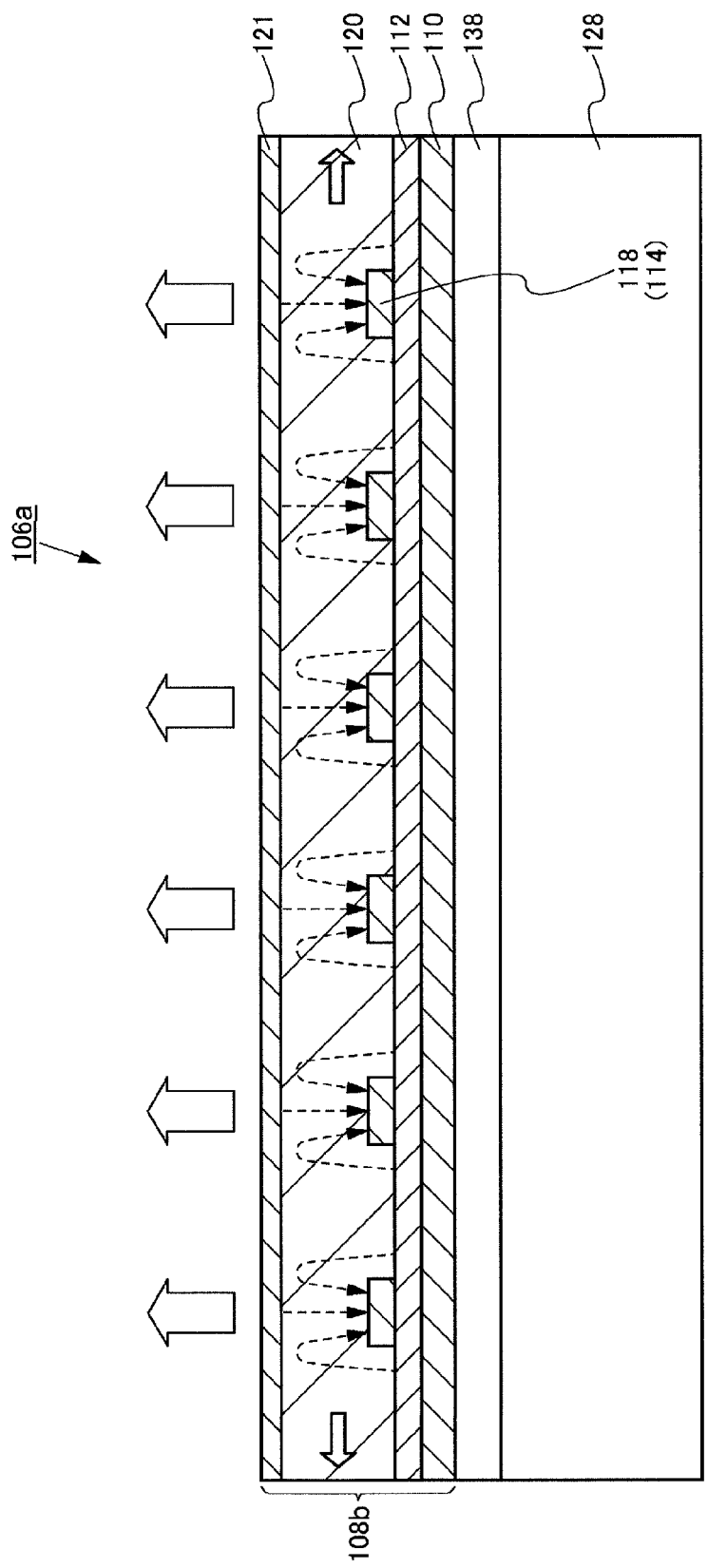
FIG. 20 is a cross-sectional diagram showing a structure of a pixel related to one embodiment of the present invention and shows and example in which a first to third electrode are provided in a light emitting layer.

FIG. 20 shows a cross-sectional structure of a pixel in a display device related to the present embodiment. The light emitting device 108b in FIG. 20 includes a first electrode 110, an insulation layer 112, a second electrode 114 and a light emitting layer 120. Furthermore, the light emitting device 108b in the present embodiment is provided with a third electrode 121 in the light emitting layer 120. The third electrode 121 is provided on a surface on the opposite side of the first electrode 110 side in the light emitting layer 120.

The third electrode 121 is provided on a light emitting surface side of the light emitting layer 120. As a result, the third electrode 121 is a translucent electrode or transparent electrode and is formed, for example, from a transparent conductive material such as indium oxide added with tin oxide (ITO), zinc oxide (ZnO) or indium oxide/zinc oxide (IZO) or a semi-transparent metal film. Although a structure in which the third electrode 121 is in contact with the light emitting layer 120 is shown in FIG. 20, an insulation layer may also be provided between the third electrode 121 and the light emitting layer 120.

It is possible to control an electric field distribution of the light emitting layer 120 by arranging the third electrode 121. Since the third electrode 121 is provided on a surface on the opposite side of the first electrode 110 and grid electrode 118 (part of the second electrode 114) sandwiching the light emitting layer 120, it is possible to control an electric field distribution which spreads in the light emitting layer 120 by mutually controlling the potential of these electrodes.

For example, in the case where a potential difference is applied between the first electrode 110 and second electrode 114, it is possible to make the potential of the third electrode 121 the same potential as the potential of the first electrode 110. In this case, an electric field is generated towards the second electrode 114 from the first electrode 110 and third electrode 121 and it is possible to spread an electric field throughout the light emitting layer 120 including a quantum dot.

Figure 21A:
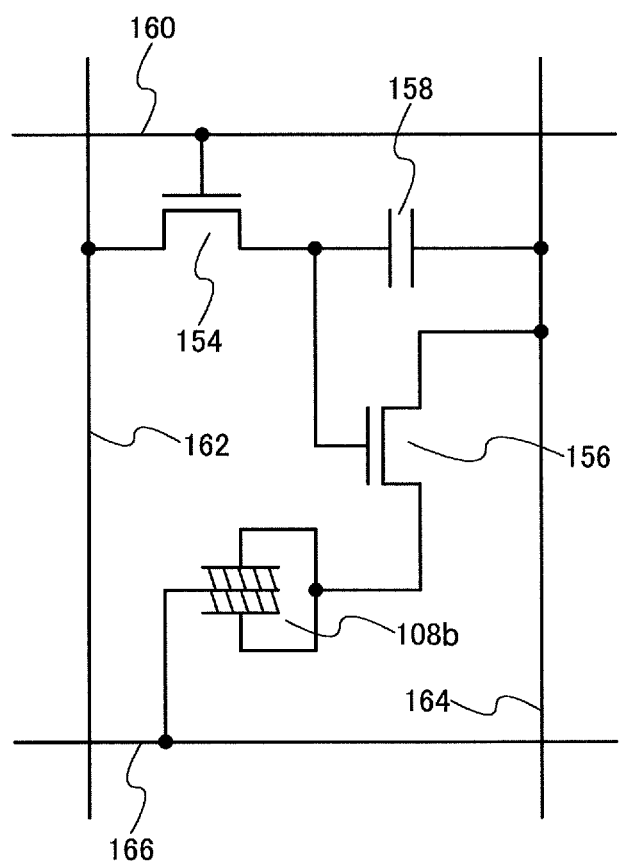
FIG. 21A shows an example of a pixel circuit related to one embodiment of the present invention.
Figure 21B:
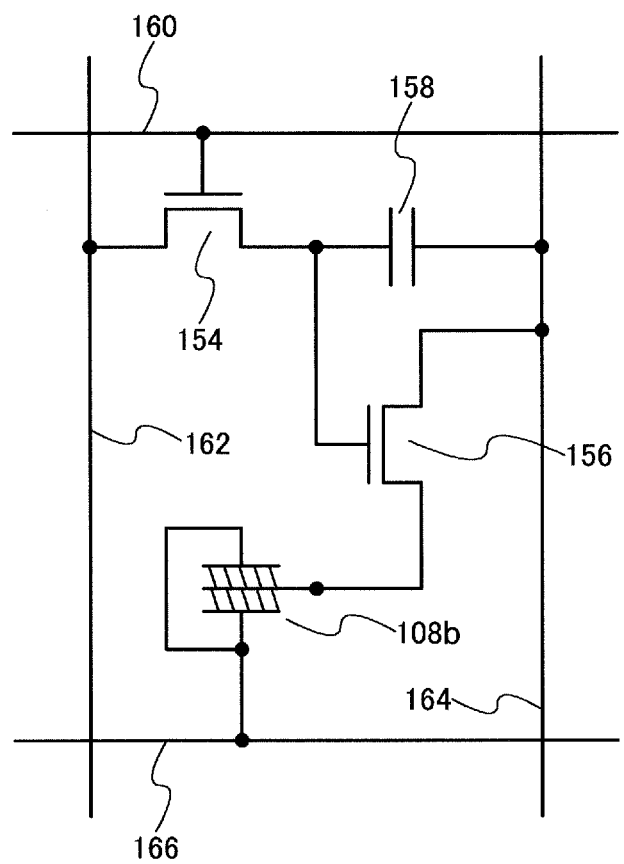
FIG. 21B shows an example of a pixel circuit related to one embodiment of the present invention.

FIG. 21A shows an example of a pixel circuit in the case where a potential is applied to the first electrode 110 and third electrode 121 of the light emitting device 108b. In the light emitting device 108b, the first electrode and third electrode are connected with a drive transistor 156 and the second electrode 114 is connected with a common potential line 166. In addition, as is shown in FIG. 21B, the first electrode and second electrode of the light emitting device 108b may be connected with the common potential line 166 and the second electrode may be connected with the drive transistor 156.

When the potential of the grid electrode 118 (part of the second electrode 114) and third electrode 121 is made a common potential with respect to the first electrode 110, since the area where the grid electrode 118 (part of the second electrode 114) and the third electrode 121 overlap becomes an equal potential and hardly contributes to emitting light. However, since it is possible to emit light using an aperture part of the grid electrode 118 (part of the second electrode 114) using the potential of the first electrode 110 and the potential difference between the grid electrode 118 (part of the second electrode 114) and the third electrode 121, it is possible to control the light emitting area in the surface of a pixel.

Figure 22A:
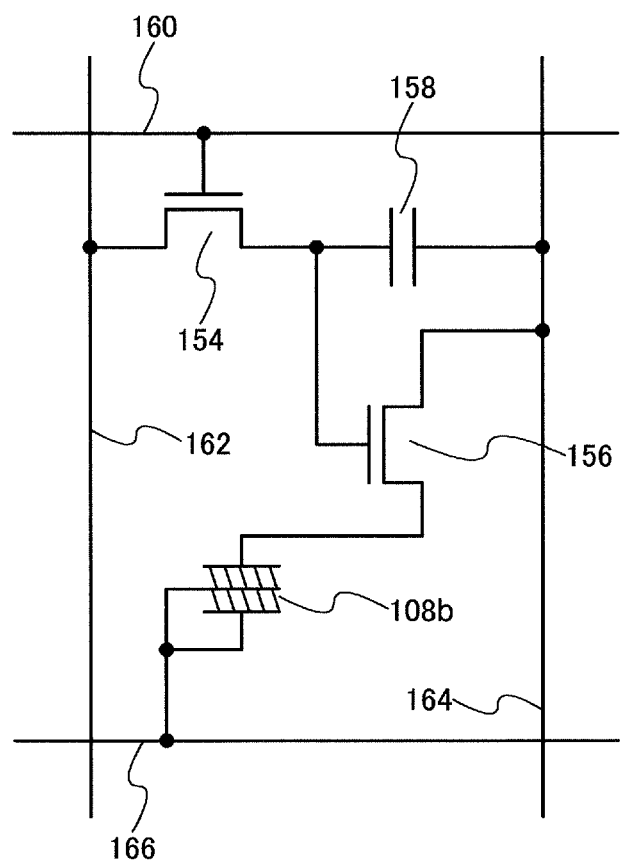
FIG. 22A shows an example of a pixel circuit related to one embodiment of the present invention.

FIG. 22A shows an example of a pixel circuit in the case where the potential of the second electrode 114 and third electrode 121 is made a common potential with respect to the potential of the first electrode 110 of the light emitting device 108b. In the light emitting device 108b, the first electrode is connected with the drive transistor 156 and the second electrode and third electrode is connected with the common potential line 166. Furthermore, the same is true in the case where the potential of the first electrode 110 and second electrode 114 is made a common potential with respect to the potential of the third electrode 121.

Figure 22B:
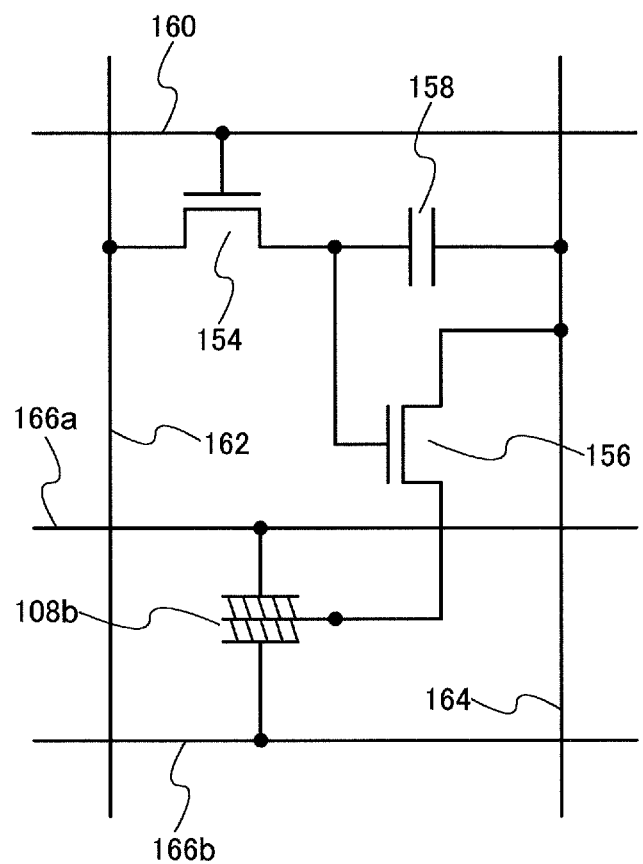
FIG. 22B shows an example of a pixel circuit related to one embodiment of the present invention.

In addition, in the light emitting device 108b shown in FIG. 20, each of the potentials of the first electrode 110, second electrode 114 and third electrode 121 may be controlled individually. FIG. 22B shows an example of a pixel circuit in this case. The second electrode of the light emitting layer 108b is connected with the drive transistor 156, the first electrode is connected with a first common potential line 166a, and the third electrode is connected with a second common potential line 166b. In the structure of this pixel circuit, when a potential is provided to the second electrode of the light emitting layer 108b based on an image signal from the drive transistor 156, if the potential of the first electrode is a certain common potential, the light emitting device 108 emits light. At this time, the potential of the third electrode is controlled so that electric field intensity becomes stronger by the second common potential line 166b and it is possible to control so that light emitting intensity is increased. In addition, reversely it is possible to control so that the light emitting intensity of the light emitting device 108b is weakened.

According to the present embodiment, in addition to the effects obtained by the display device in the second embodiment, it is possible to increase light emitting efficiency and more accurately control light emitting intensity by provided a third electrode in a light emitting device.

Fourth Embodiment

Structure of a Display Device

Figure 23:
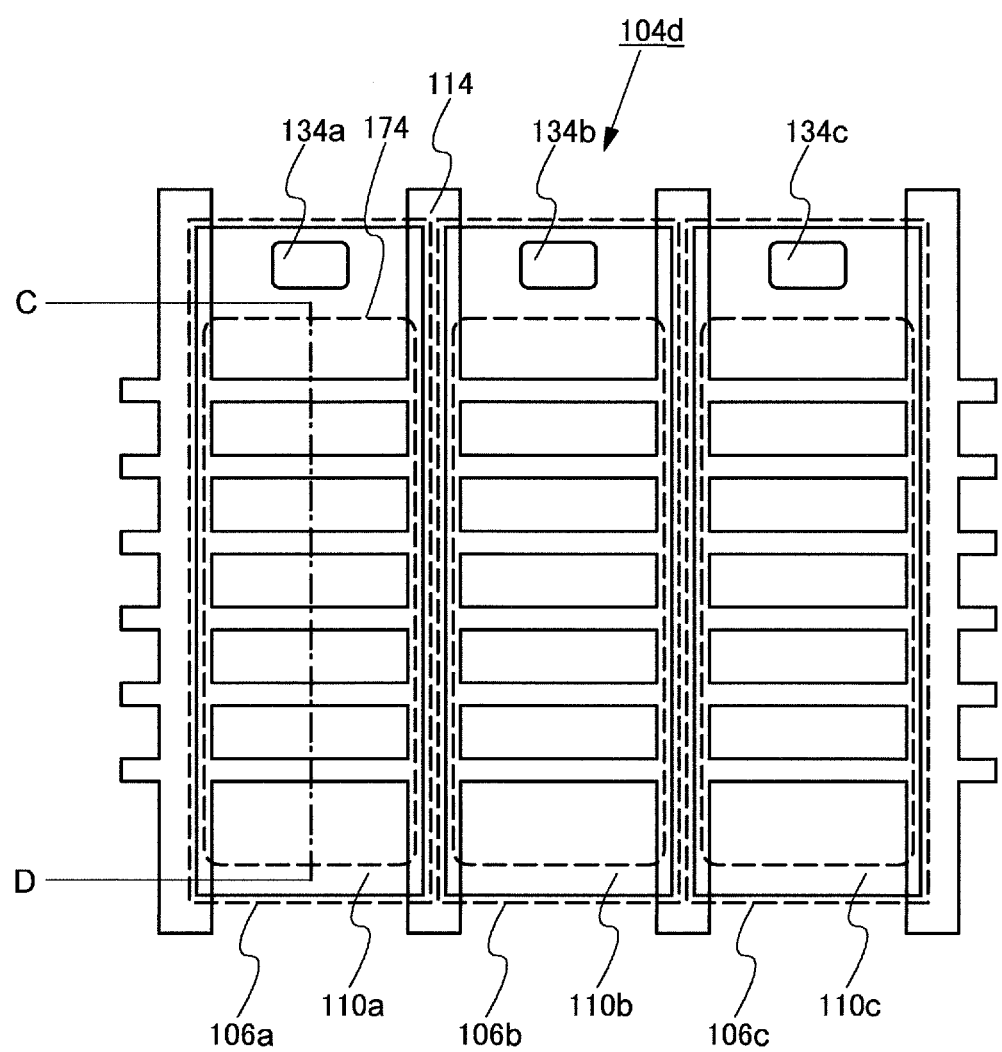
FIG. 23 is a planar view diagram showing a structure of a pixel related to one embodiment of the present invention and shows an example in which a first electrode includes a concave shaped structure.
Figure 24:
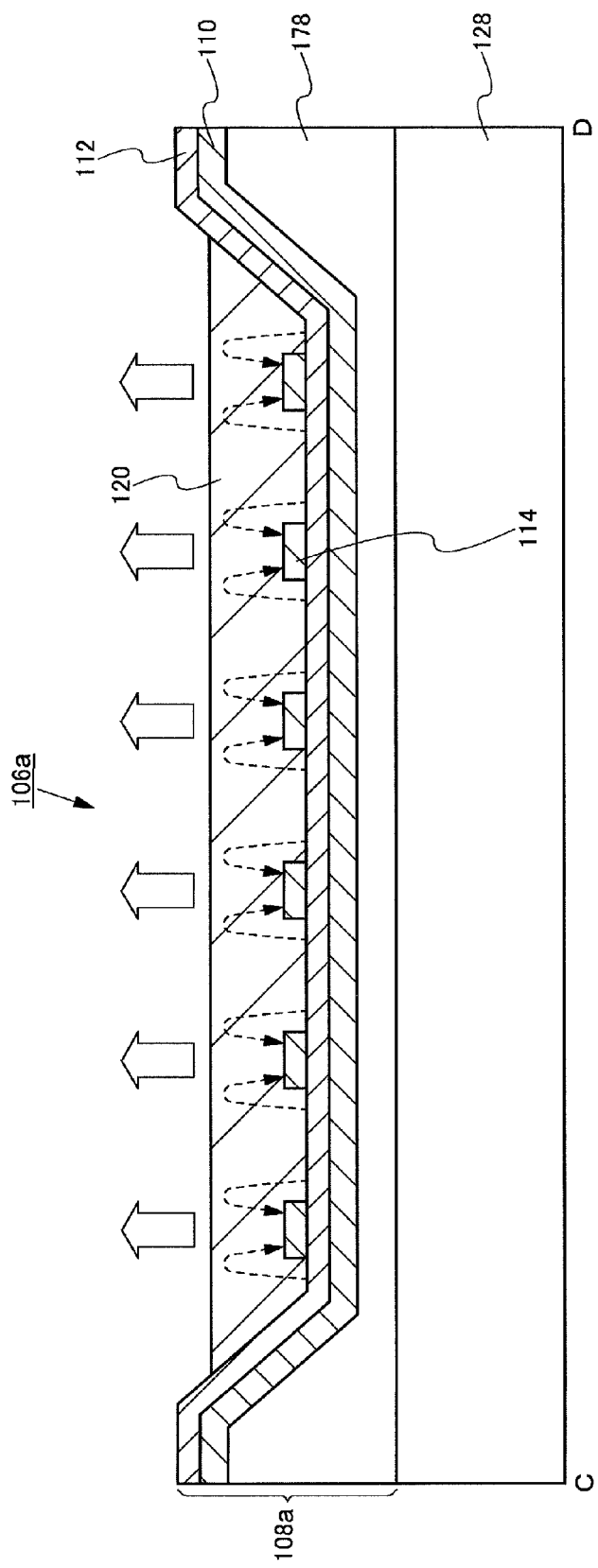
FIG. 24 is a planar view diagram showing a structure of a pixel related to one embodiment of the present invention and shows an example in which a first electrode includes a concave shaped structure.

The present embodiment shows a structure of a pixel which can gather light emitted from a light emitting device in one direction. FIG. 23 is a planar view diagram for explaining a pixel 104d of the display device related to the present invention. In addition, a cross-sectional structure along the line C-D shown in FIG. 23 is shown in FIG. 24.

As is shown in FIG. 23, the pixel 104d is provided with a first sub-pixel 106a corresponding to red, a second sub-pixel 106b corresponding to red and a third sub-pixel 106c corresponding to red adjacent to each other. In the present embodiment, assuming that the first electrode 110 (first electrode 110a, first electrode 110b, first electrode 110c) is not flat but the center is a roughly flat reference surface, the electrode periphery edge part includes an inclined surface which curves upwards (surface side provided with the light emitting layer 120). That is, the first electrode 110 (first electrode 110a, first electrode 110b, first electrode 110c) includes a flat part located on a bottom surface side of the light emitting layer 120 and a side surface part provided to enclose the light emitting layer 120. In the present specification, the form of this first electrode is sometimes called a "bathtub structure". In addition, this structure is sometimes referred to as "concave structure part".

The second electrode 114 is provided above the first electrode via an insulation layer in the concave structure part 174. As explained in the second embodiment, for example the second electrode 114 is formed by a pattern combining the grid electrode 118 and bus electrode 116. The light emitting layer 120 is provided on an upper surface of the insulation layer 112. The light emitting layer is provided so as to fill at least an aperture part in the second electrode 114. In addition, the light emitting layer 120 is provided at least on the inner side of the concave structure part 174.

The first electrode 110 is formed using a metal material to form a reflective surface. Light emitted from the light emitting layer 120 is emitted in all directions. Light emitted to the first electrode 110 from the light emitting layer 120 is reflected by the first electrode 110 and at least a part is emitted from the upper surface of the light emitting layer 120. On the other hand, light wave-guided horizontally through the light emitting layer 120 is reflected by a side surface part in the periphery edge part of the concave structure part 174. In this way, light leaking to an adjacent pixel is suppressed. Furthermore, the light reflected to the light emitting layer 120 is emitted from the upper surface of the light emitting layer 120, and is emitted to the outside.

The depth of the concave structure part 174 provided in each sub-pixel 106 (first sub-pixel 106a, second sub-pixel 106b, third sub-pixel 106c) is preferred to be at least deeper than the thickness of the second electrode 114 and more preferably a depth where the light emitting layer 120 is buried. By adopting this type of structure, it is possible to reflect light wave-guided through the light emitting layer 120 at the inclined surface provided in the periphery edge part of the concave structure part 174 and increase light extraction efficiency.

The shape of the first electrode 110 described above forms a concave surface by processing a ground insulation film and manufacture is possible by arranging a metal film for forming an electrode along this concave surface. In addition, it is possible to form a concave surface structure by processing a metal film form forming an electrode. Alternatively, it is possible to form a concave structure by stacking a plurality of metal films and overlapping and aligning a metal film for forming a bottom surface of the concave structure part 174 and a metal film for forming an inclined surface.

In this way, according to the pixel structure of the present embodiment, it is possible to gather light emitted by a light emitting layer in the direction of a light emitting surface. In this way, it is possible to extract light diffused horizontally in a light emitting layer to the exterior. That is, it is possible to increase the extraction efficiency of light emitted by a pixel.

<Structure of a Pixel>

FIG. 23 shows an example in which a first sub-pixel 106a corresponding to red, a second sub-pixel 106b corresponding to green and a third sub-pixel 106c corresponding to blue are provided. The light emitting color of each sub-pixel may be emitted by making the composition of a quantum dot material and size of a particle different to emit light in a certain color.

Figure 25:
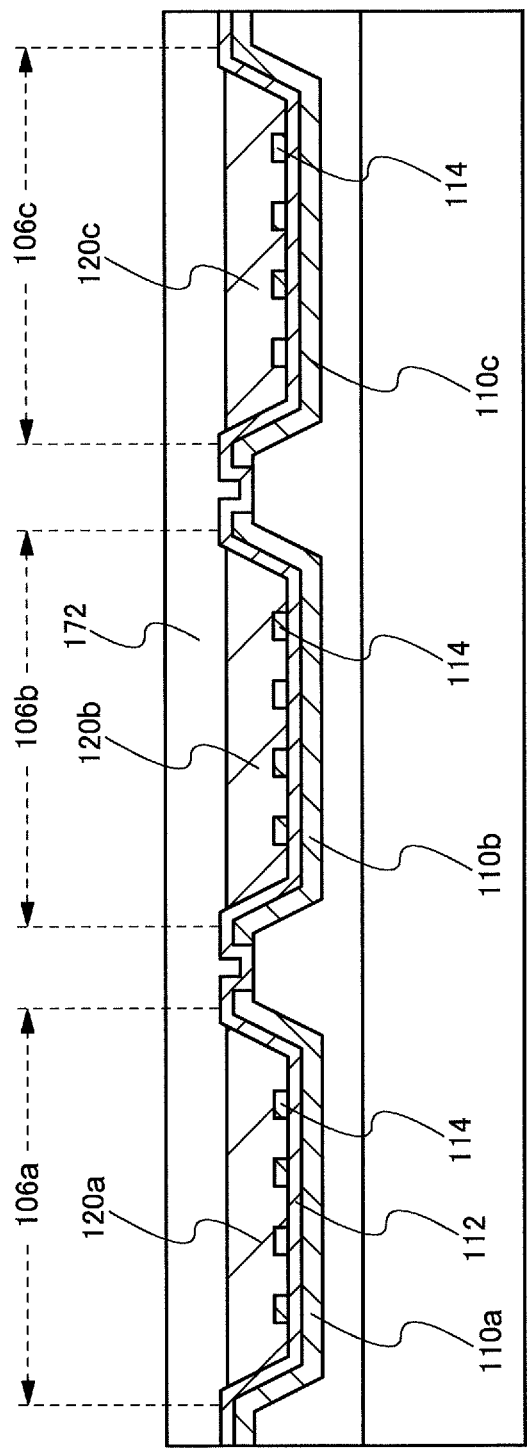
FIG. 25 is a cross-sectional diagram showing a structure of a pixel related to one embodiment of the present invention and shows an example in which a first electrode includes a concave shaped structure and a light emitting device with different light emitting wavelengths provided in each sub-pixel.

FIG. 25 (A) shows an example in which the first emitting layer 120a, second light emitting layer 120b and third light emitting layer 120c with different light emitting colors in each sub-pixel are provided. In FIG. 25 (A), the first electrode 110 (first electrode 110a, second electrode 114b, second electrode 114c) are individually provided in each sub-pixel and the second electrode 114 is provided as a common electrode between sub-pixels. In addition, an insulation layer 112 is provided above the first electrode 110. According to the structure in FIG. 25 (A), by arranging the first light emitting layer 120a, second light emitting layer 120b and third light emitting layer 120c including a quantum dot corresponding to each color, it is possible to form a pixel which emits light with a high color purity.

At this time, since the concave structure part 174 is provided in each sub-pixel, for example, the light which is wave-guided horizontally among the light emitted by the first sub-pixel 106a is reflected by an inclined surface of the concave structure part 174. As a result, it is possible to prevent light leaking an adjacent second sub-pixel 106b. Therefore, color mixing is prevented and it is possible to display an image with high color purity in combination with effects of a quantum dot.

Figure 26:
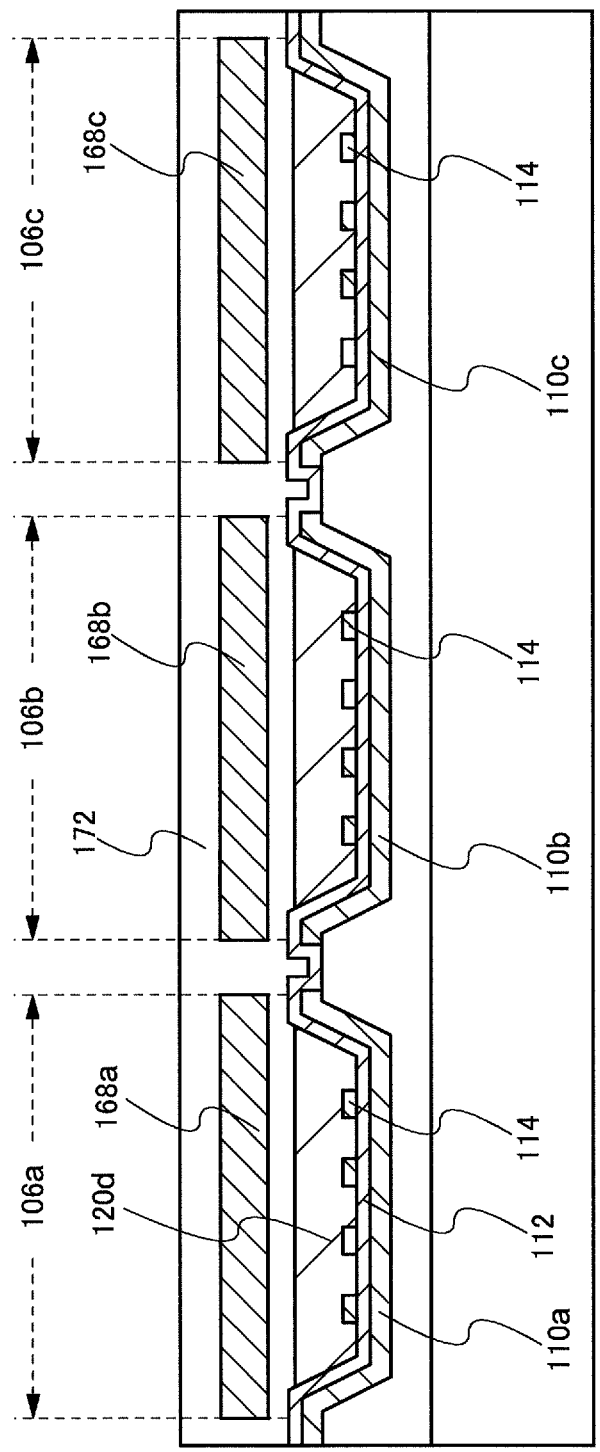
FIG. 26 is a cross-sectional diagram showing a structure of a pixel related to one embodiment of the present invention and shows an example in which a first electrode includes a concave shaped structure and a color filter provided in each sub-pixel.

FIG. 26 shows an example of a pixel structure in which a light emitting layer 120d which emits white light is provided in common in a first sub-pixel 106a, second sub-pixel 106b and third sub-pixel 106c, and a first color filter layer 168a corresponding to red, first color filter layer 168b corresponding to green and first color filter layer 168c corresponding to blue are provided with respect to each sub-pixel respectively. According to the structure in FIG. 36, since it is not necessary to divide and provide a light emitting layer for each sub-pixel, it is easy to manufacture a light emitting layer.

At this time, although the light emitted from each sub-pixel is a single color, for example, the light emitted by the first sub-pixel 106a is emitted in an oblique direction and can be suppressed from entering the color filter layer 168b of the adjacent second sub-pixel 106b.

Figure 27:
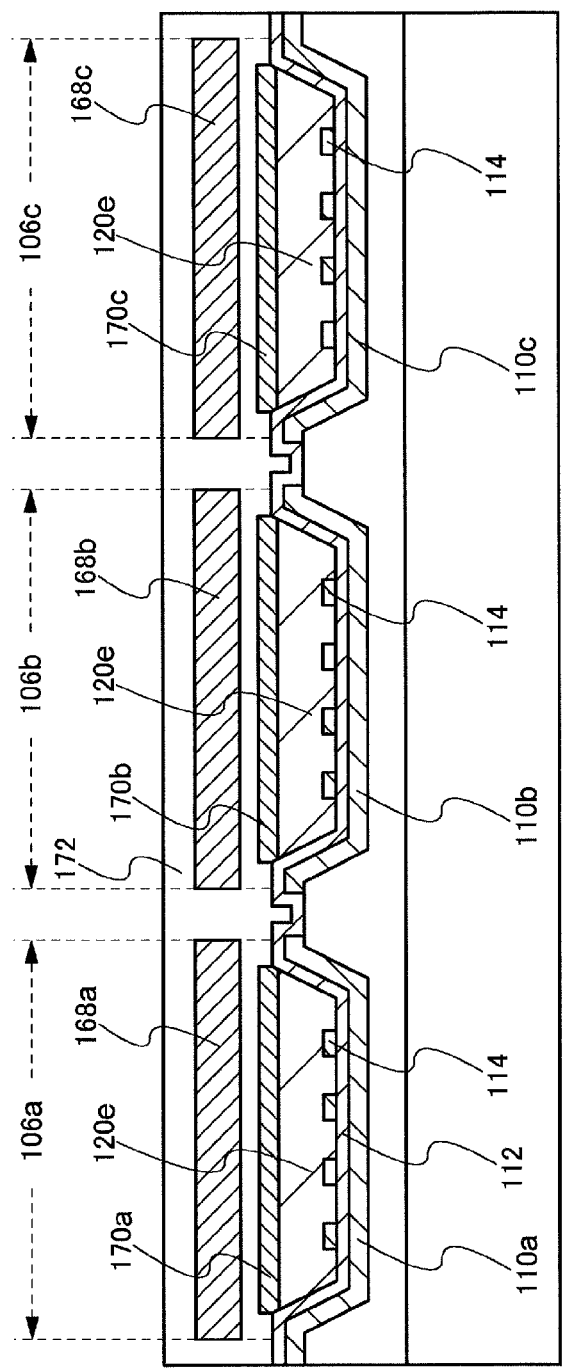
FIG. 27 is a cross-sectional diagram showing a structure of a pixel related to one embodiment of the present invention and shows an example in which a first electrode includes a concave shaped structure and a color filter and color conversion layer provided in each sub-pixel.

FIG. 27 shows an example of arranging a light emitting layer 120e which emits blue light or infrared light commonly in each sub-pixel. A first color conversion layer 170a corresponding to red, a second color conversion layer 170b corresponding to green and a third color conversion layer 170c are arrange above the light emitting layer 120e according to each pixel. By emitting blue light or infrared light emitted from the light emitting layer 120b to each color conversion layer, light corresponding to each color is emitted from the color conversion layers. A color filter layer 168 (first color filter layer 168a corresponding to red, a first color filter layer 168b corresponding to green and a first color filter layer 168c corresponding to blue) may be combined in order to increase the color purity of the light emitted from the color conversion layers. In addition, a color conversion layer may convert light to white or a light close to white and may be provided to be continuous with each sub-pixel.

In this case, it is possible to suppress light leaking to an adjacent pixel and mixing of colors by the concave structure part provided in each sub-pixel.

According to FIG. 25, FIG. 26 and FIG. 27, it is possible to make the structure of a light emitting device in each sub-pixel in common by making the quantum dot in the light emitting layer different, or by arranging a single color light emitting layer common to each sub-pixel and by making the wavelength of light emitted from a pixel different using a color filter layer and/or a color conversion layer.

<Manufacturing Process>

Figure 28A:
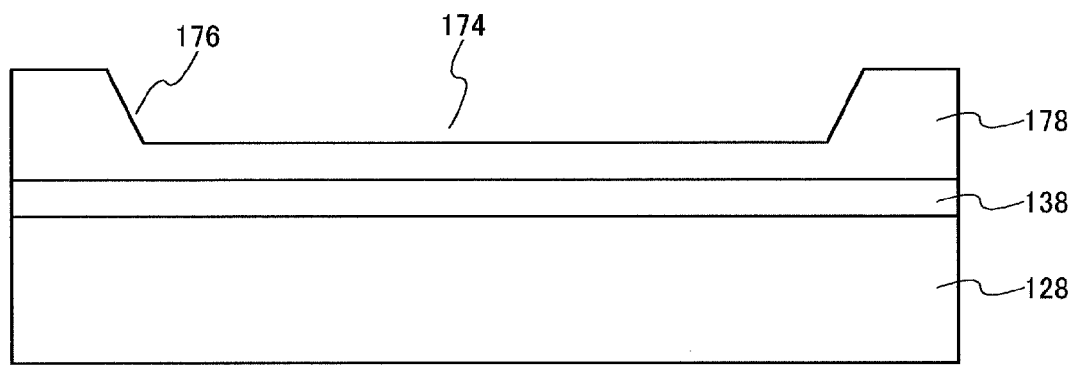
FIG. 28A is a cross-sectional diagram for explaining a manufacturing method of a pixel related to one embodiment of the present invention.
Figure 28B:
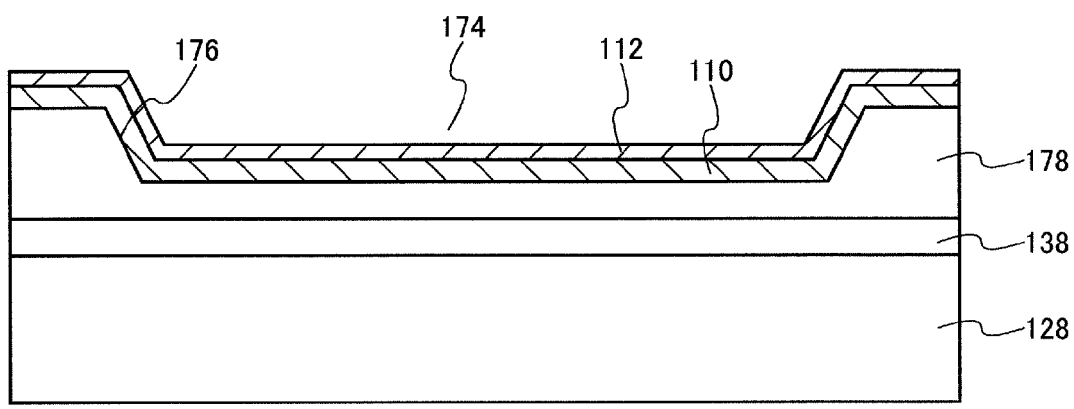
FIG. 28B is a cross-sectional diagram for explaining a manufacturing method of a pixel related to one embodiment of the present invention.
Figure 28C:
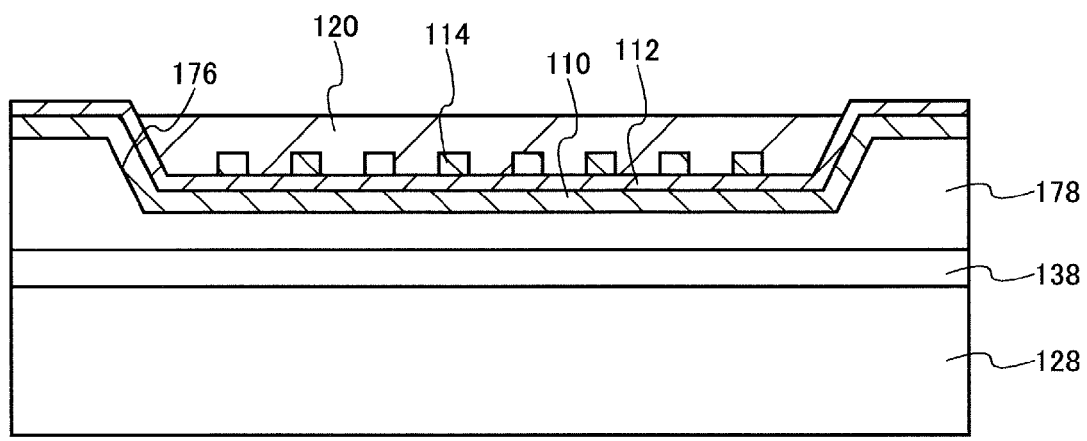
FIG. 28C is a cross-sectional diagram for explaining a manufacturing method of a pixel related to one embodiment of the present invention.

A manufacturing method of a display device related to the present embodiment is explained while referring to FIG. 28A to FIG. 28C.

FIG. 28A shows a step for manufacturing a ground insulation film 178. The ground insulation film 178 is provided above a substrate 128 which serves as the base of a display device. The ground insulation film 178 can be provided above an interlayer insulation film 142 for burying a control device or wiring for forming a pixel circuit. The ground insulation film 178 can be formed using an inorganic insulation material or organic insulation material. It is possible to use silicon oxide or silicon nitride as the inorganic insulation material. It is possible to use polyimide rein or acrylic resin as the organic insulation material.

A concave structure part 174 is formed aligned with the position for forming a light emitting device in the ground insulation film 178. The concave structure part 174 can be formed by digging by etching the ground insulation film 178. In addition, the concave structure part 174 can be formed by forming the ground insulation film 178 using a plurality of layers. For example, a second ground insulation film may be formed with a higher etching rate than a first ground insulation film above the first ground insulation film which is roughly flat, and concave structure part 174 can be formed by selectively etching the second ground insulation film.

The side wall part 176 of the concave structure part 174 provided in the ground insulation film 178 is preferred to be an inclined surface. By arranging a first electrode along this side wall part 176, it is possible to use the first electrode as a reflective surface for reflecting light emitted by the light emitting layer. As a result, considering the step covering properties of the first electrode and the function as a light reflective surface, the incline angle of the inclined part 176 is preferred to be in a range of 30 degrees to 70 degrees and more preferably from 45 degrees to 60 degrees. In addition, the height of the step produced by the concave structure part 174 is preferred to be from 2.8 µm to 10 µm and more preferably from 0.5 µm to 5 µm. By providing this step height, it is possible to use the first electrode as a reflective plate by arranging the first electrode along the inclined part 176 of the concave structure part 174.

FIG. 28B shows a step for forming the first electrode 110 and insulation layer 112 on an upper surface of the ground insulation film 178 formed with the concave structure part 174. The first electrode 110 is formed from a metal material. For example, the first electrode 110 can be formed using a metal material such as aluminum (Al) or silver (Ag). The insulation layer 112 is formed after patterning a metal film such as aluminum (Al) or silver (Ag) formed by a thick film above the ground insulation film 178 and forming the first electrode 110. The insulation layer 112 is formed to a thickness from 100 nm to 1000 nm using an insulation material such as silicon oxide or silicon nitride. In addition, in the case where the first electrode 110 is formed from aluminum (Al), the surface of the aluminum (Al) may be oxidized using an anodic oxidation process as the insulation layer 112.

FIG. 28C shows a step for forming the second electrode 114 and light emitting layer 120 above the insulation layer 112. The second electrode 114 is provided on an upper part of the first electrode 110 and the grid electrode 118 is formed in an extending pattern from the bus electrode 116 so that it is possible to generate a fringe electric field. The second electrode 114 an be manufactured using a metal material such as aluminum (Al), titanium (Ti), tantalum (Ta), molybdenum (Mo), or tungsten (W), or an alloy material of thee such as molybdenum (Mo)-tungsten (W) alloy. In addition, a transparent conductive film may be formed such as ITO, ZnO or IZO.

The light emitting layer 120 including a quantum dot is provided above the insulation layer 112 and at least the grid electrode 118 (part of the second electrode 114). The light emitting layer 120 is overlapping the first electrode 110. The light emitting layer 120 is provided on at least the inner side of the concave structure part 174. It is necessary to make the size of the quantum dots different in order to make the color of the light emitted by each sub-pixel different. In this case, by arranging the light emitting layer of each sub-pixel on the inner side of the concave structure part 174, separating and forming a light emitting layer without interfering with adjacent sub-pixels.

The light emitting layer 120 including a quantum dot is formed by various manufacturing methods. For example, a quantum dot colloid dispersion liquid is coated and deposited above the insulation layer 112 by a coating method such as spin coating or dipping, screen printing, offset printing, flexographic printing, typographic printing. At this time, a covariant solution of fine particles or an inorganic semiconductor which serves as a mother material of the light emitting layer 120 and a quantum dot may be used. In addition, an organic solution dispersed with quantum dots may be sprayed and ionized and this may be deposited above the insulation layer 112 which is the surface to be deposited. Furthermore, a solution including a quantum dot may be formed using an inkjet method. In this way, a film including a quantum dot is formed above the insulation layer 112 using a coating method so that the second electrode 114 is buried, and it is possible to formed the light emitting layer 120 by performing a heat treatment according to necessity and removing the remaining solution.

A cover film such as silicon nitride may also be formed as a protective film in the upper surface of the light emitting layer 120. In addition, a sealing substrate is provided and maybe provided so as not to be directly exposed to the air. In addition, in the case where the light emitting layer is a light emitting body of a single color and a color conversion layer and/or color filter layer is provided, these layers maybe provided above the light emitting layer 120.

Figure 29A:
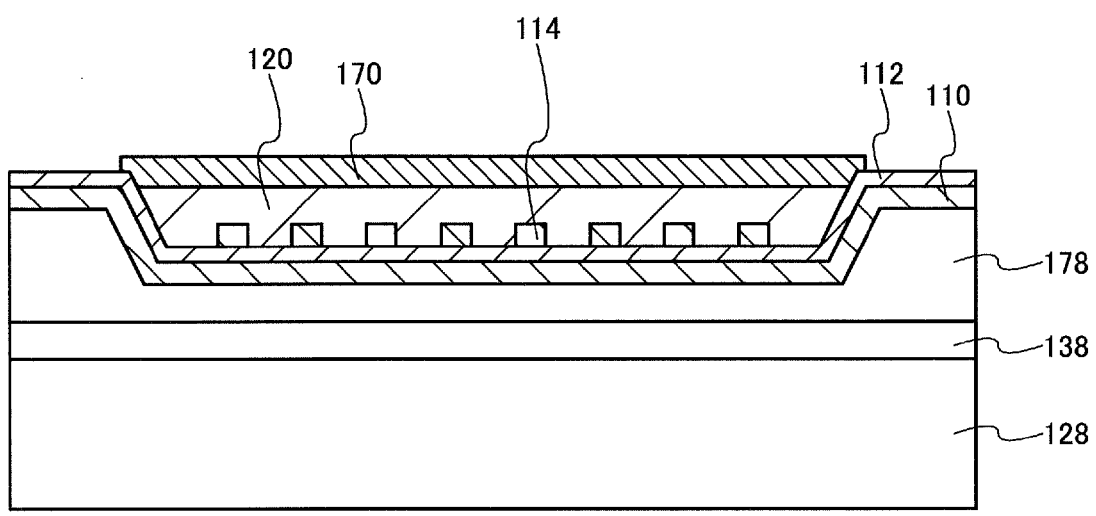
FIG. 29A is a cross-sectional diagram for explaining a manufacturing method of a pixel related to one embodiment of the present invention.
Figure 29B:
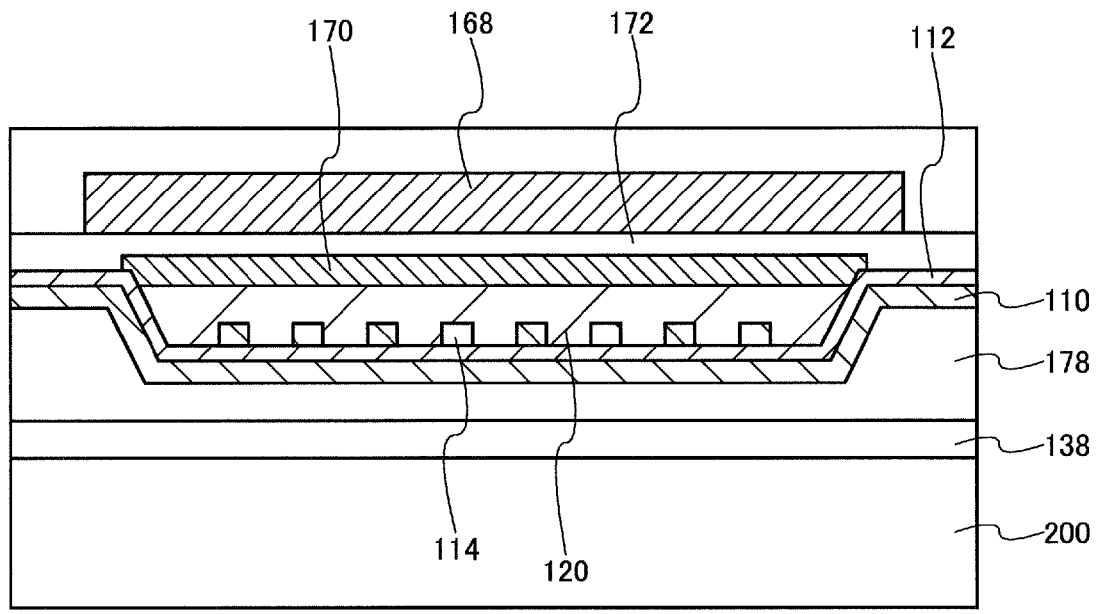
FIG. 29B is a cross-sectional diagram for explaining a manufacturing method of a pixel related to one embodiment of the present invention.

FIG. 29A shows a structure in which a color conversion layer 170 is provided above the light emitting layer 120. As is shown in FIG. 29A, by arranging the color conversion layer 170 close to the light emitting layer 120, light emitted from the light emitting layer 120 is sufficiently absorbed and it is possible to prevent light leaking to an adjacent pixel. Furthermore, in FIG. 29A, a color filter layer may be provided instead of a color conversion layer. FIG. 29B shows a structure in which a color filter layer 168 is repeatedly provided above the color conversion layer 170. An insulation layer 172 may also be provided between the color conversion layer 170 and the color filter layer 168.

In the structure shown in FIG. 29A and FIG. 29B, in order to perform a color display it is not necessary to separate light emitting layers 120 for each pixel (each sub-pixel), and since it is possible to separate color conversion layers and/or color filter layers corresponding to each pixel (each sub-pixel) using a printing method, although the number of processes increases the degree of difficulty of a process decreases.

According to the present embodiment as described above, by curving a periphery edge part of a first electrode positioned on a rear surface side of a light emitting device provided in a pixel so as to enclose a rear surface and side surface of a light emitting layer, it is possible to effectively use the first electrode as a reflective plate. In this way, the direction of the light emitted by a light emitting layer including a quantum is controlled to a surface side (emitting side) and it is possible to increase light extraction efficiency.

In addition, as stated in the second embodiment, the light intensity of a light emitting device in each pixel is controlled by an interval between a first electrode and second electrode, that is, is controlled by the thickness of an insulation layer provided between the first electrode and second electrode and by a pattern of the second electrode, thereby it is possible to ensure no bad effects are received even when the film thickness of a light emitting layer varies. As a result, even if the pixel part of a display device, that is, even if the area of a display screen is expanded, it is possible to reduce variation in light emitting intensity. In addition, by including a quantum dot in a light emitting layer, the peak of a light emitting spectrum becomes sharp and it is possible to emit light with high color purity, thereby it is possible to display a vivid image. Furthermore, by adopting a structure in which a light emitting device of each pixel is not provided with an electrode in an upper surface part of a light emitting layer which includes a quantum dot, it is possible to increase the light emitting efficiency and light extraction efficiency an achieve low power consumption of a display device.

Fifth Embodiment

Figure 30:
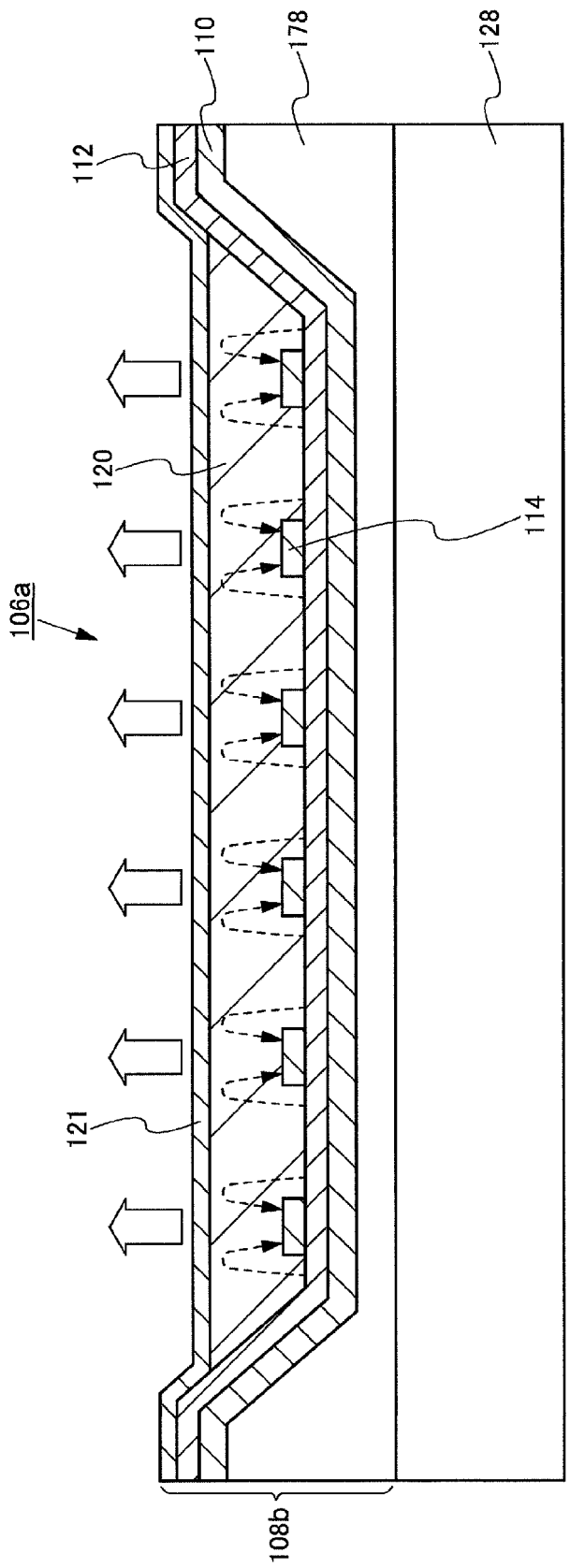
FIG. 30 is a cross-sectional diagram showing a structure of a pixel related to one embodiment of the present invention and shows an example in which a first to third electrode is provided in a light emitting layer and the first electrode has a concave shaped structure.

FIG. 30 shows a sub-pixel of a display device related to the present embodiment. The display device related to the present embodiment includes a first electrode 110 having a bathtub structure the same as that shown in the fourth embodiment. That is, the light emitting device 108b includes a structure in which the first electrode 110 is a reflective electrode and has a periphery edge part which is curved and provides the directionality of emitted light. Furthermore, as is shown in the third embodiment, a third electrode 121 is provided facing the first embodiment 110. The third embodiment 121 is provided on a surface of a light emitting side of the light emitting layer 120.

According to the present embodiment, it is possible to increase light emitting efficiency and more accurately control light emitting intensity by provided a third electrode in a light emitting device the same as in the third embodiment.

Sixth Embodiment

A display device related to a sixth embodiment of the present invention is explained while referring to FIG. 31A, FIG. 31B, FIG. 31C and FIG. 32. In contrast to a light emitting device provided in a pixel explained in the second embodiment, a different structure of a first electrode is shown in the present embodiment.

Figure 31A:
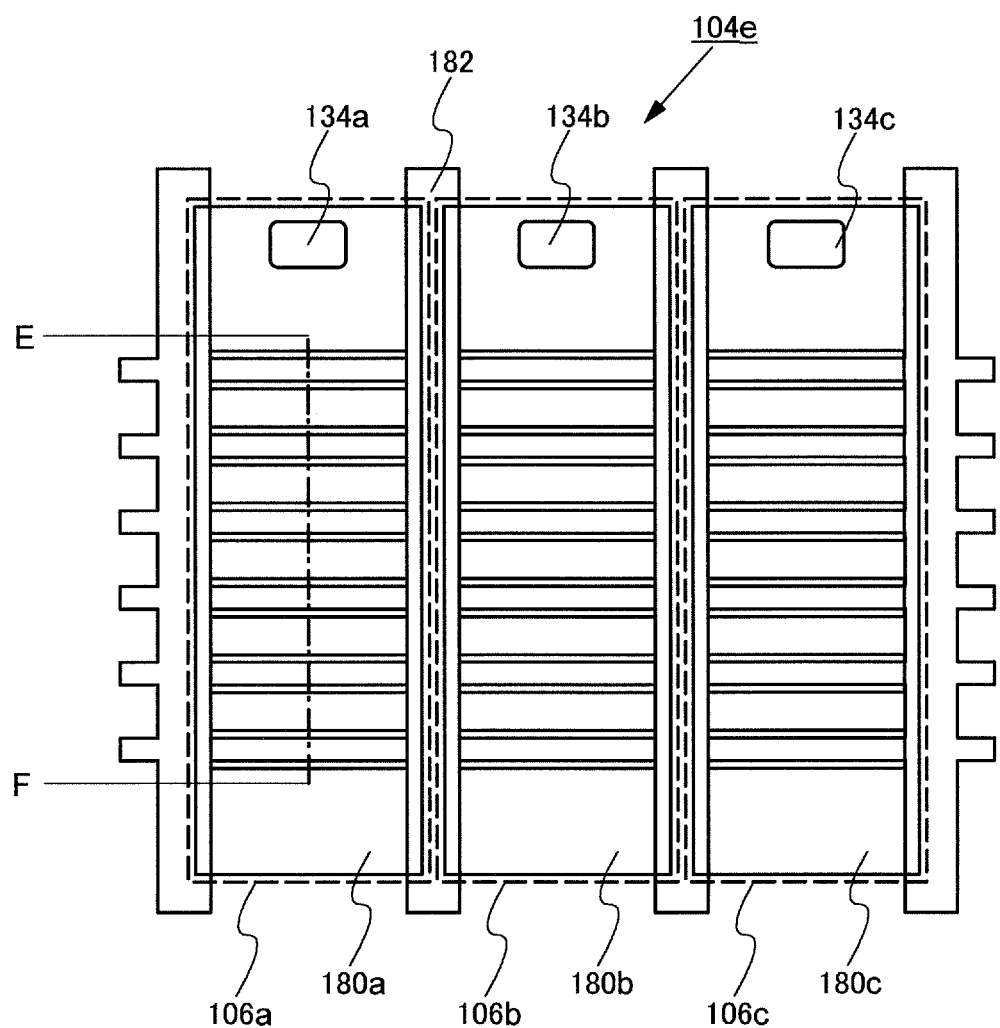
FIG. 31A is a planar view diagram showing a structure of a pixel related to one embodiment of the present invention and shows an example in which a first electrode and a second electrode are provided so as to be meshed with each other in a comb shape.
Figure 31B:
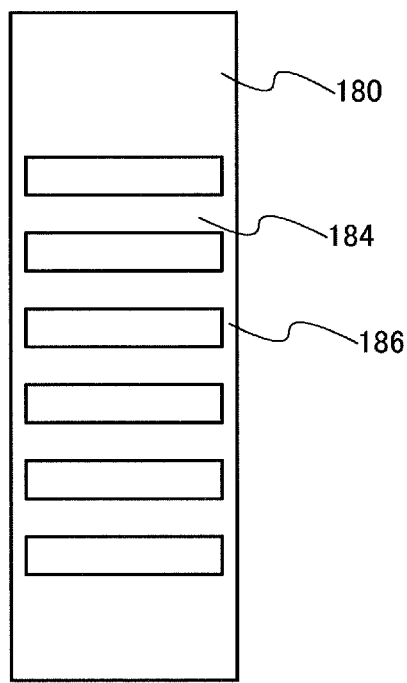
FIG. 31B shows a structure of a pixel electrode including a bus electrode and a grid electrode related to one embodiment of the present invention.
Figure 31C:
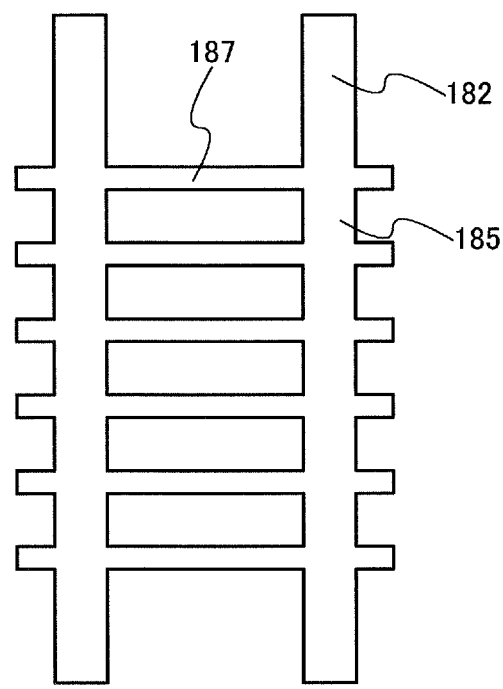
FIG. 31C shows a structure of a pixel electrode including a bus electrode and a grid electrode related to one embodiment of the present invention.
Figure 32:
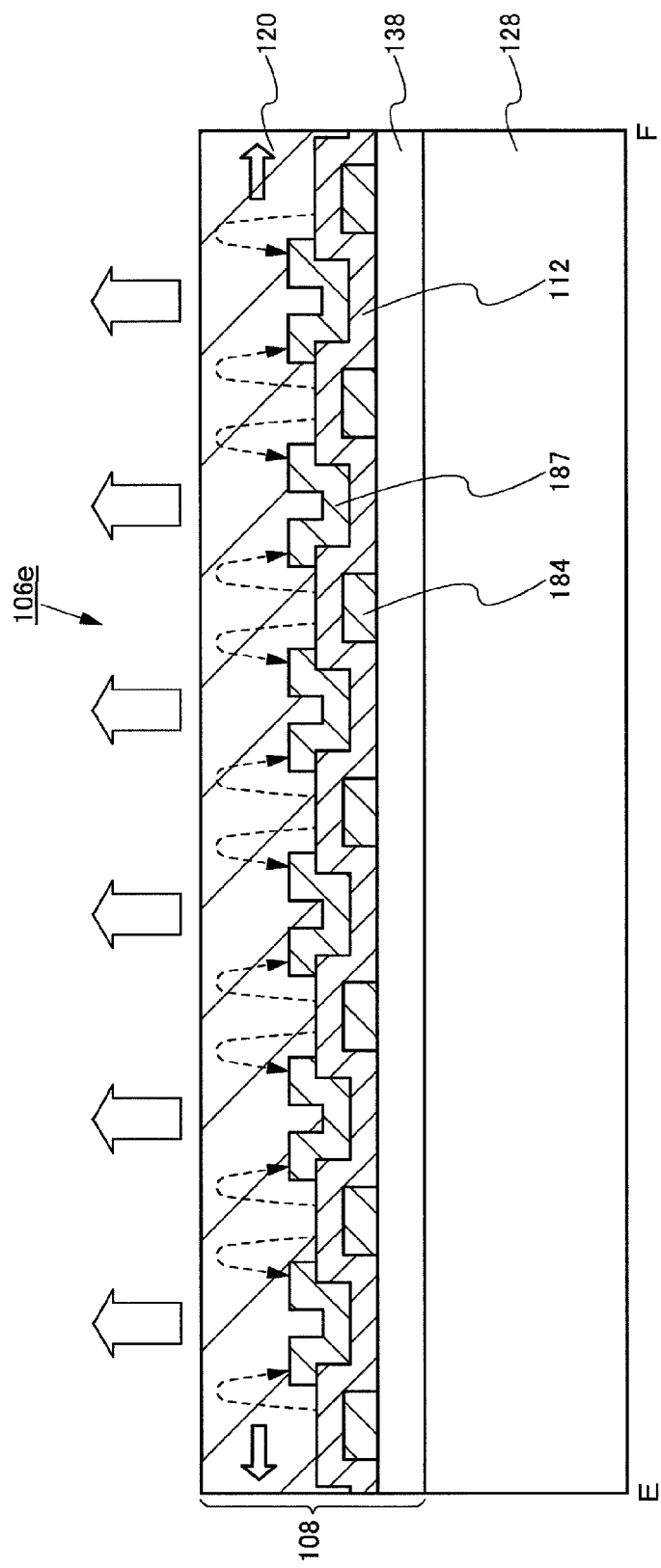
FIG. 32 is a cross-sectional diagram showing a structure of a pixel related to one embodiment of the present invention and shows an example in which a first electrode and a second electrode are provided so as to be meshed with each other in a comb shape.

FIG. 31A shows a planar view of a pixel 104e in a display device of the present embodiment, FIG. 31B shows a first electrode 180 including a bus electrode 184 and grid electrode 186, and FIG. 31C shows a second electrode 182 including a bus electrode 185 and grid electrode 187. In addition, a cross-sectional structure along the line E-F shown in FIG. 31A is shown in FIG. 32. FIG. 31A shows a form whereby a first sub-pixel 106a, second sub-pixel 106b and third sub-pixel 106c are provided in the pixel 104e. The second electrode 182 is formed with the grid electrode 187 extending from the bus electrode 185 in a strip shaped or comb pattern in each sub-pixel. The first electrode 180 is formed with the grid electrode 186 extending from the bus electrode 184 in a strip shaped or comb pattern so as to mesh with the strip shaped or comb pattern of the second electrode 182. The first electrode 180 and second electrode 182 can be formed using a metal and therefore can be provided with a reflection function for reflecting the light emitted by the light emitting layer 120.

Referring to FIG. 32, the first electrode 180 and second electrode 182 is alternately provided sandwiching the insulation layer 112. By adopting this type of structure, it is possible to further bring a strip shaped or comb shaped pattern end part of the first electrode 180 and a strip shaped or comb shaped pattern end part of the second electrode closer together. When a potential is provided to the first electrode 180 and second electrode 182, the first electrode 180 and an end part of the second electrode 182 are brought close together sandwiching the insulation layer 112 and thereby it is possible to strengthen electric field intensity. In this way, it is possible to increase light emitting efficiency. In addition, since it is possible to reduce the area where the first electrode 180 and second electrode 182 overlap, it is possible to reduce the capacitance component of the light emitting device 108 and drive the device at a higher speed.

Furthermore, in the present embodiment, except that the different structure of the first electrode 180, the remaining structure is the same as in the second embodiment. In addition, it is possible to apply the structure of the first electrode and second electrode shown in FIG. 17, FIG. 18, FIG. 19A or FIG. 19B for the first electrode and second electrode in the present embodiment.

That is, the first electrode 180 may be made a common electrode which provides a common potential to a plurality of pixels (sub-pixels) and the second electrode 182 may be made an individual electrode. In addition, the potential of the first electrode 180 and second electrode 182 may be individually controlled in each pixel (sub-pixel) respectively.

The pixel 132e may be provided with repeated color filter layers in each sub-pixel as shown in FIG. 15. In addition, a color conversion layer and color filter layer may be repeated and provided as shown in FIG. 16. Furthermore, the first electrode and second electrode may include a chevron type structure as is shown in FIG. 19A and FIG. 19B.

According to the present embodiment, in addition to the effects obtained in the second embodiment, because it is possible to increase electric field intensity related to the light emitting device, it is possible to obtain emitted light with greater luminosity. Alternatively, it is possible to drive the light emitting device at a low voltage in the case where the luminosity of the light emitting device is made constant.

Seventh Embodiment

Figure 33A:
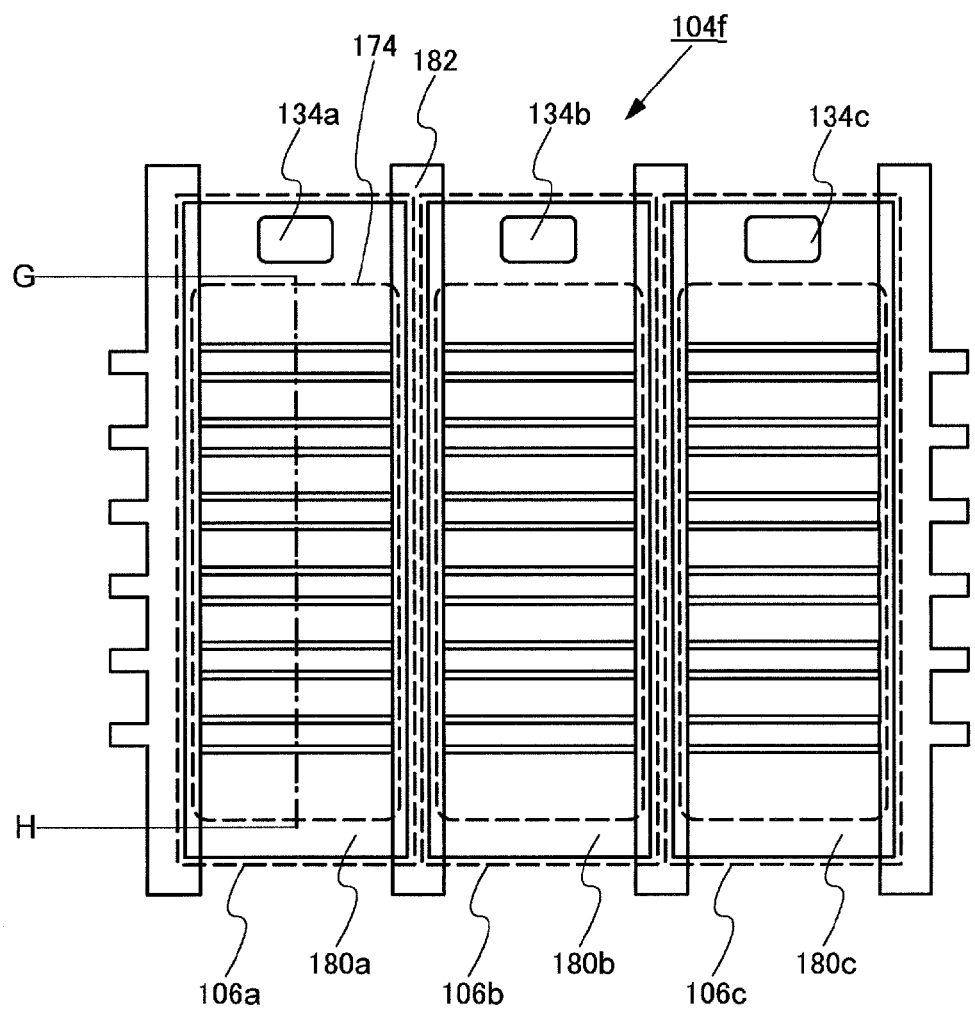
FIG. 33A is a planar view diagram showing a structure of a pixel related to one embodiment of the present invention and shows an example in which a first electrode has a concave shaped structure and the first electrode and a second electrode are provided so as to be meshed with each other in a comb shape.
Figure 33B:
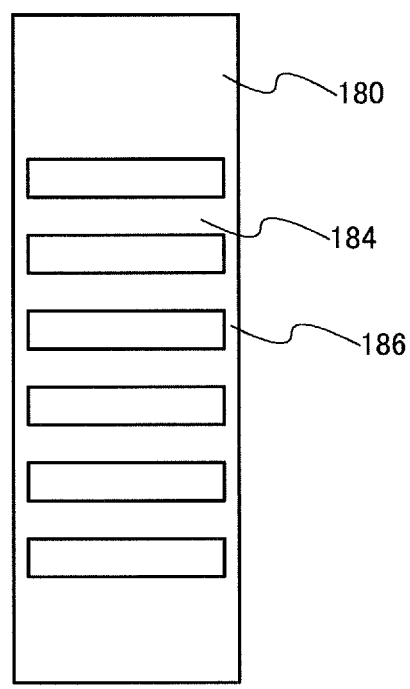
FIG. 33B shows a structure of a pixel electrode including a bus electrode and a grid electrode related to one embodiment of the present invention.
Figure 33C:
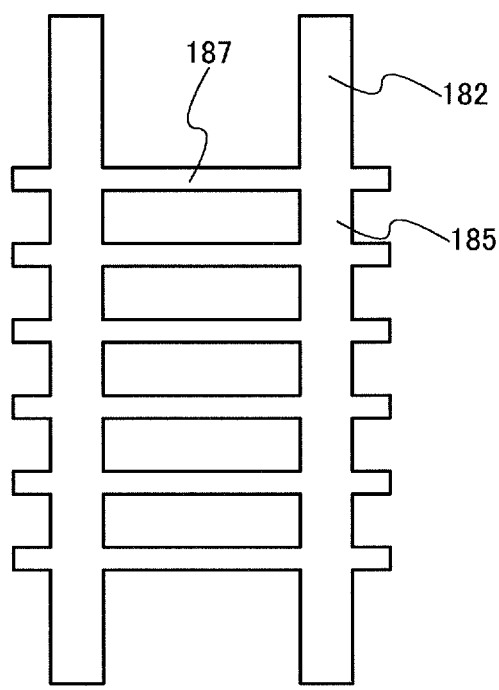
FIG. 33C shows a structure of a pixel electrode including a bus electrode and a grid electrode related to one embodiment of the present invention.
Figure 34:
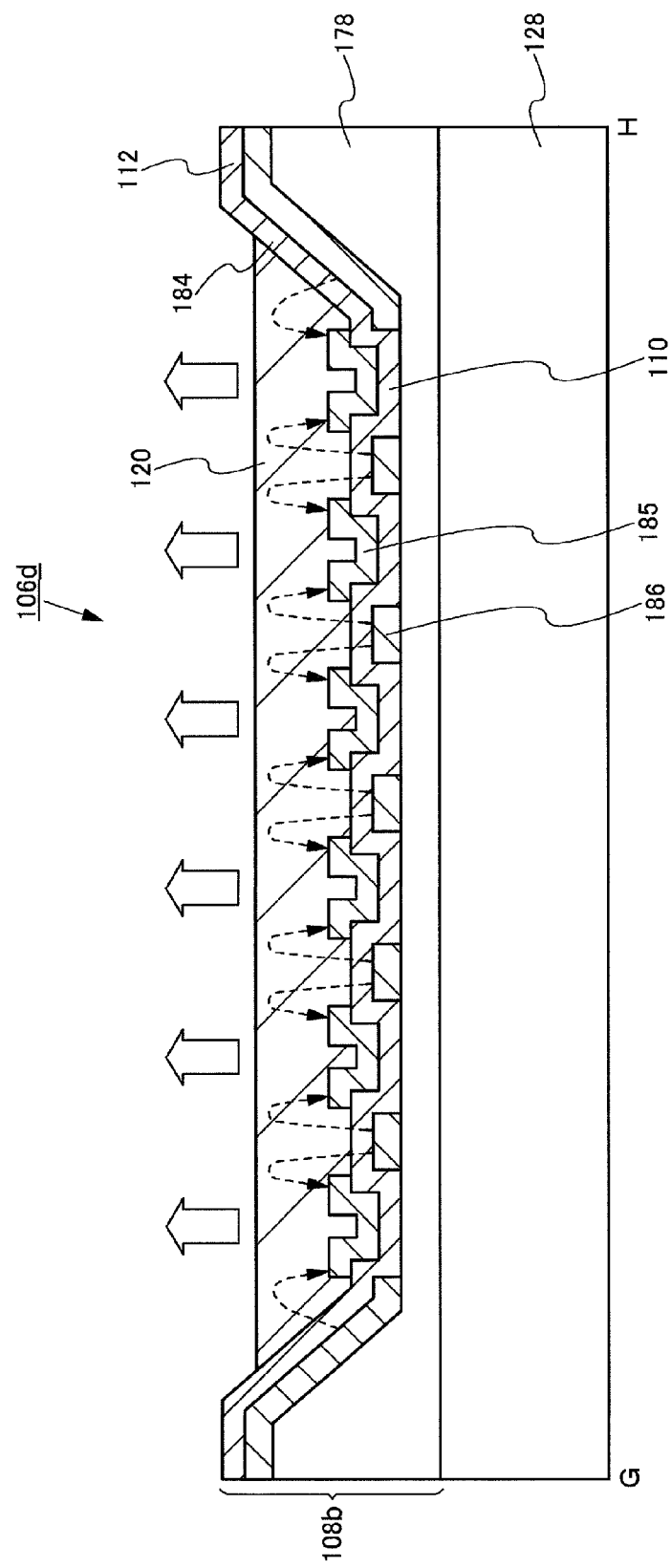
FIG. 34 is a cross-sectional diagram showing a structure of a pixel related to one embodiment of the present invention and shows an example in which a first electrode has a concave shaped structure and the first electrode and a second electrode are provided so as to be meshed with each other in a comb shape.

The present embodiment shows an example in which a pixel having a bathtub structure shown in the fourth embodiment is applied to the pixel structure shown in the sixth embodiment. FIG. 33A shows a planar view of a pixel 104f related to the present embodiment, FIG. 33B shows the first electrode 180 including the bus electrode 184 and grid electrode 186, and FIG. 33C shows a first electrode 180 including the bus electrode 185 and grid electrode 187. In addition, a cross-sectional structure along the line G-H shown in the same diagram is shown in FIG. 34.

In the present embodiment, except for the first electrode 180 having a bathtub structure, the form of the light emitting device 108 is the same as in the sixth embodiment. Reflecting the shape of the concave structure part 174 provided in a pixel (sub-pixel), the first electrode 180 includes an inclined surface in which the bus electrode 184 curves upwards in a periphery edge part. The first electrode 180 is formed from metal and includes a reflection function for reflecting the light emitting by the light emitting layer 120.

The light emitted by the light emitting layer 120 being emitted to a front surface side (direction shown by the arrow shown in FIG. 34), the light emitted to the first electrode 180 side is reflected and emitted to in a front surface direction. In addition, by arranging the first electrode 180 is a bathtub shape, it is possible to reflect the light which is wave-guided through the light emitted layer 120 using this surface and emit the light in a front surface direction.

According to the present embodiment, in addition to the effects obtained in the sixth embodiment, by including the first electrode with a bathtub shape, it is possible to gather and emit the light emitted by the light emitting layer to a front surface side. In this way, since it is possible to extract the light diffused in a horizontal direction in the light emitting layer to the exterior, it is possible to effectively utilize light and increase exterior quantum efficiency.

Eighth Embodiment

Figure 35:
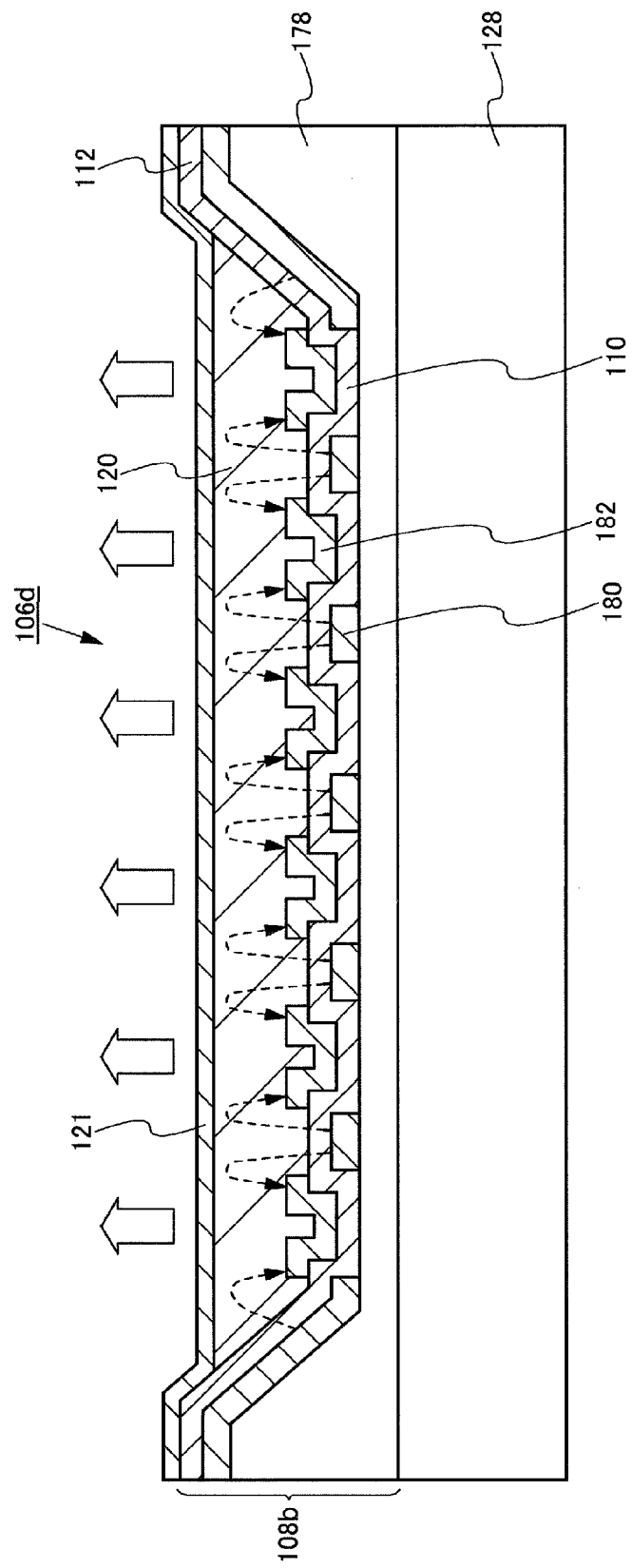
FIG. 35 is a cross-sectional diagram showing a structure of a pixel related to one embodiment of the present invention and shows an example in which a first to third electrode are provided in a light emitting layer, the first electrode has a concave shaped structure and the first electrode and a second electrode are provided so as to be meshed with each other in a comb shape.

FIG. 35 shows a pixel 104f of a display device related to the present embodiment. The display device related to the present embodiment has the same bathtub structure as in the seventh embodiment. That is, the light emitting device provided in the pixel 104f includes a first electrode 180 having a bathtub structure and as well as the first electrode 110 being a reflection electrode, the periphery edge part curves and directionality is provided to the emitting of light. Furthermore, as is shown in the third embodiment, a third electrode 121 is provided facing the first electrode 110. The third electrode 121 is provided on a surface on the light emitting side of the light emitting layer 120.

According to the present embodiment, by arranging a third electrode in a light emitting device the same as in the third embodiment, it is possible to increase light emitting efficiency and more accurately control light emitting intensity.

Ninth Embodiment

The present embodiment exemplifies a structure of a pixel which can increase color purity of light emitted from a light emitted device.

Figure 36:
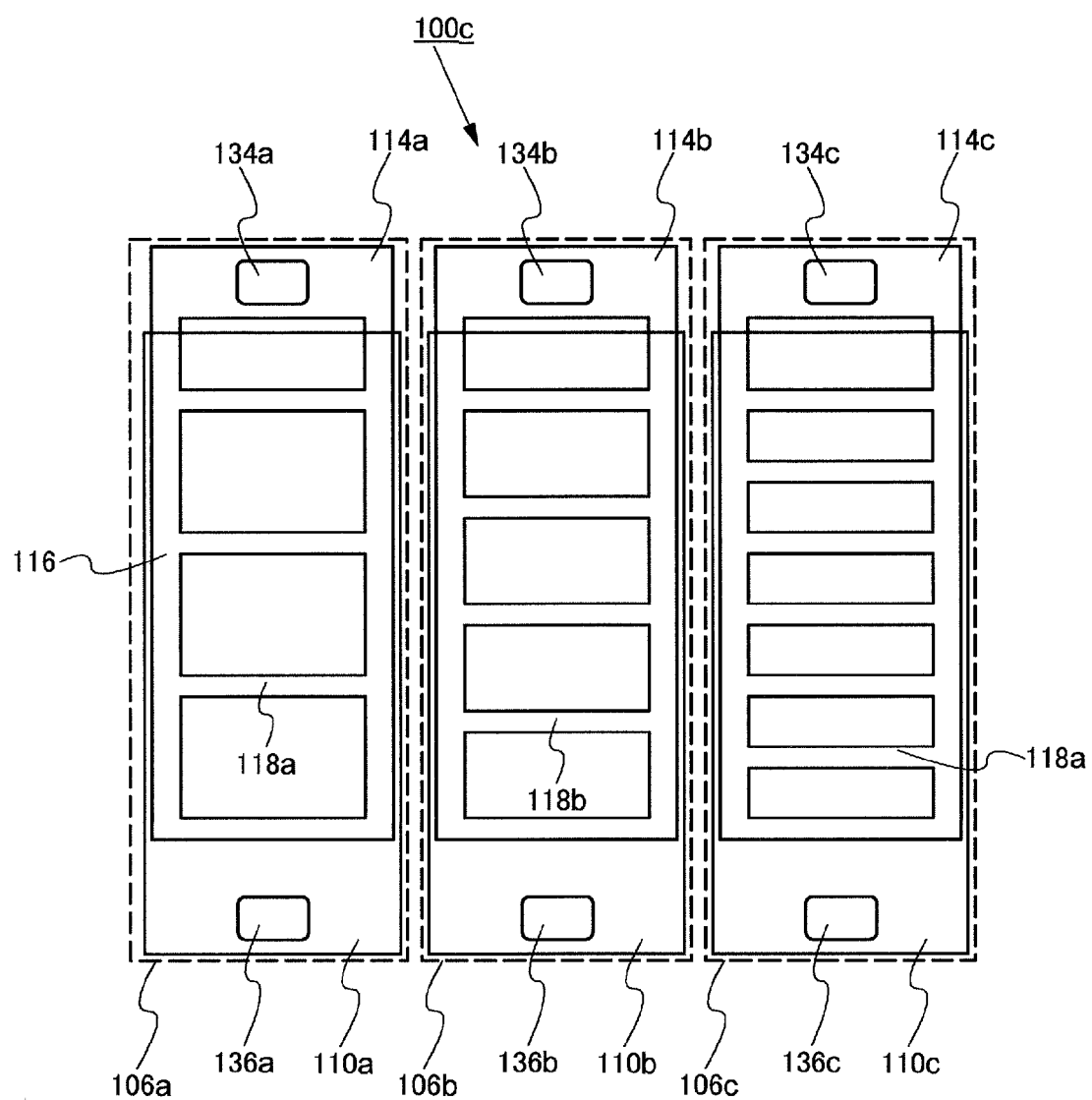
FIG. 36 is a planar view diagram showing a structure of an electrode provided in a pixel related to one embodiment of the present invention.

A planar view of a pixel 100c related to the present embodiment is shown in FIG. 36. A first sub-pixel 106a, second sub-pixel 106b and third sub-pixel 106c are included in the pixel 100c. In FIG. 36, a plate shaped first electrode 110, a bus electrode 116 extending in one direction above the first electrode, and a second electrode 114 including a plurality of grid electrodes 118 extending from the bus electrode 114 are included in each sub-pixel.

In FIG. 36, the pitch of a grid electrode 118a of the second electrode 114a in the first sub-pixel 106a corresponding to red, the pitch of a grid electrode 118b of the second electrode 114b in the second sub-pixel 106b corresponding to green, and the pitch of a grid electrode 118c of the second electrode 114c in the third sub-pixel 106c corresponding to blue are respectively different.

For example, when a center wavelength of the first pixel 104a corresponding to red is give as 0.75 μm, a center wavelength of the second sub-pixel 106b corresponding to green is give as 0.55 μm, and a center wavelength of the third sub-pixel 106c corresponding to blue is give as 0.45 μm, the interval between grid electrode of the second electrode in each sub-pixel can be made an integral multiple of each wavelength.

In this way, based on the wavelength emitted by each sub-pixel, a pixel which emits light with a long wavelength is matched with the wavelength of an interval between grid electrodes of the second electrode and widened, and by matching a short wavelength sub-pixel with a light emitting wavelength and shortening the wavelength, it is possible to utilize the interference effects of light and increase the color purity of the emitted light.

The structure of the pixel electrode shown in FIG. 36 can be applied instead of an electrode of a light emitting device in each pixel shown in the second to eighth embodiments. By applying the structure of the electrode shown in the present embodiment, in addition to the effects obtained in each embodiment described above, it is possible to obtain the effect of being able to increase color purity of emitted light.

What is claimed is:

1. A display device comprising:
a pixel part provided with a plurality of pixels;
a light emitting device provided in the pixel, the light emitting device including a light emitting layer including a quantum dot, a first electrode provided on one surface of the light emitting layer, an insulation layer provided between the light emitting layer and the first electrode, and a second electrode provided between the light emitting layer and the insulation layer, and at least one end part of the second electrode layer being provided over the first electrode; and
a control device contacting the first electrode directly and overlapping a part of the first electrode.

2. The display device according to claim 1, wherein the first electrode has a light reflecting surface on the light emitting layer side.

3. The display device according to claim 1, wherein a periphery edge part of the first electrode curves to the side of light emitting layer.

4. The display device according to claim 1, wherein the first electrode is provided along a concave part of the insulation layer provided on a ground side of the first electrode and a periphery edge part of the first electrode overlaps a step region of the concave part.

5. The display device according to claim 1, wherein a third electrode is provided on a surface on an opposite side to the first electrode in the light emitting layer.

6. The display device according to claim 1, wherein the second electrode includes a bus electrode and a grid electrodes extending from the bus electrode, one end part of the second electrode is included in the grid electrode.

7. The display device according to claim 1, wherein the second electrode includes a bus electrode and a plurality of grid electrode extending from the bus electrode, the plurality of grid electrodes curving in a chevron shape.

8. The display device according to claim 1, wherein the second electrode includes a bus electrode and a plurality of grid electrode extending from the bus electrode, an interval between the plurality of grid electrodes is an integral multiple of a center light emitting wavelength of the light emitting device.

9. The display device according to claim 1, wherein the first electrode is individually provided corresponding to the pixel in the pixel part, and the second electrode is provided in common in a plurality of pixels included in the pixel part.

10. The display device according to claim 1, wherein the first electrode is provided in common in a plurality of pixels included in the pixel part, and the second electrode is individually provided corresponding to the pixel in the pixel part.

* * * * *